(12) United States Patent
Koketsu et al.

(10) Patent No.: US 8,633,603 B2
(45) Date of Patent: Jan. 21, 2014

(54) SEMICONDUCTOR DEVICE AND A METHOD OF MANUFACTURING THE SAME

(71) Applicant: Renesas Electronics Corporation, Kawasaki (JP)

(72) Inventors: Masami Koketsu, Tokyo (JP); Toshiaki Sawada, Nanae (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/840,625

(22) Filed: Mar. 15, 2013

(65) Prior Publication Data

US 2013/0307036 A1    Nov. 21, 2013

Related U.S. Application Data

(63) Continuation of application No. 13/525,122, filed on Jun. 15, 2012, now Pat. No. 8,421,250, which is a continuation of application No. 13/081,208, filed on Apr. 6, 2011, now Pat. No. 8,314,502, which is a continuation of application No. 12/365,823, filed on Feb. 4, 2009, now Pat. No. 8,008,788.

(30) Foreign Application Priority Data

Feb. 14, 2008    (JP) .................................. 2008-032666

(51) Int. Cl.
*H01L 23/544*    (2006.01)

(52) U.S. Cl.
USPC .................................... 257/797; 257/E21.237

(58) Field of Classification Search
USPC .......................................... 257/797, E21.237
See application file for complete search history.

(56) References Cited

U.S. PATENT DOCUMENTS

| 5,640,049 | A | 6/1997 | Rostoket et al. |
| 6,242,792 | B1 | 6/2001 | Miura et al. |
| 7,534,695 | B2 | 5/2009 | Suzuki et al. |
| 7,825,529 | B2 | 11/2010 | Horii |
| 2004/0188709 | A1 | 9/2004 | Sheck |
| 2005/0161836 | A1 | 7/2005 | Yudasaka et al. |

FOREIGN PATENT DOCUMENTS

| JP | 11-330247 A | 11/1990 |
| JP | 2000-182914 A | 6/2000 |
| JP | 2004-079693 A | 3/2004 |
| JP | 2005-150559 A | 6/2005 |
| JP | 2007-524991 A | 8/2007 |

OTHER PUBLICATIONS

Office Action issued Jan. 8, 2013, in Japanese Patent Application No. 2008-032666.
Office Action issued Jan. 31, 2012, in Chinese Patent Application No. 200910002219.4.

*Primary Examiner* — Luan C Thai
(74) *Attorney, Agent, or Firm* — Miles & Stockbridge P.C.

(57) ABSTRACT

In a semiconductor chip constituting an LCD driver, a mark is formed in an alignment mark formation region over a semiconductor substrate. The mark is formed in the same layer as that of an uppermost layer wiring (third layer wiring) in an integrated circuit formation region. Then, in the lower layer of the mark and a background region surrounding the mark, patterns are formed. At this time, the pattern P1*a* is formed in the same layer as that of a second layer wiring and the pattern P1b is formed in the same layer as that of a first layer wiring. Further, the pattern P2 is formed in the same layer as that of a gate electrode, and the pattern P3 is formed in the same layer as that of an element isolation region.

15 Claims, 30 Drawing Sheets

SEMICONDUCTOR DEVICE AND A METHOD OF MANUFACTURING THE SAME

CROSS-REFERENCE TO RELATED APPLICATION

The present application claims priority from Japanese patent application No. 2008-32666 filed on Feb. 14, 2008, the content of which is hereby incorporated by reference into this application.

BACKGROUND OF THE INVENTION

The present invention relates to a semiconductor device and a method of manufacturing the same and more particularly to a technique which is useful for the application to an LCD (Liquid Crystal Display) driver that drives a liquid crystal display unit and manufacturing thereof.

In Japanese patent laid-open No. 11-330247 (patent document 1), a technique is described, which can accurately detect an alignment mark when forming an alignment mark for laser trimming within a chip. Specifically, the surface of a semiconductor substrate made of SOI substrate has a tapered part oblique with respect to the normal direction at least in the peripheral region of the alignment mark and laser light is caused to reflect in a direction different from the normal direction at the tapered part. With the arrangement, it is possible to reduce the reflection of laser light in the normal direction of the semiconductor substrate in the peripheral region of the alignment mark, and therefore, the alignment mark can be accurately distinguished from its peripheral region. Consequently, it is concluded that the detection of an alignment mark can be accurately carried out also when forming an alignment mark within a chip. In this case, the tapered part is formed in the same layer as that of an element isolation region formed over the semiconductor substrate.

In Japanese patent laid-open No. 2000-182914 (patent document 2), a technique is described, which provides a mark with which an image can be stably recognized and detected with high precision in an alignment mark for image recognition to be attached to a semiconductor device. Specifically, in the peripheral region of a cross-shaped mark main body part formed as a solid pattern of aluminum layer, a diffusion reflection layer made of aluminum is formed. As a diffusion reflection layer, a stripe-shaped, grating-shaped, or dot-shaped fine pattern formed by an aluminum layer can be used. Patent document 2 also describes that openings are formed with a fine pattern of stripe shape etc. in an interlayer insulating film in the lower layer and an aluminum layer having an irregular (level differences) pattern corresponding to the pattern of the openings can be used as a diffusion reflection layer. In this case, the diffusion reflection layer formed in the peripheral region of the cross-shaped mark main body part is formed in the same layer as that of the mark main body part.

SUMMARY OF THE INVENTION

Recently, an LCD using a liquid crystal as a display element has prevailed rapidly. The LCD is controlled by a driver that drives an LCD. An LCD driver is configured by a semiconductor chip and mounted on, for example, a glass substrate. A semiconductor chip constituting an LCD driver has a structure in which a plurality of transistors and multilayer wirings is formed over a semiconductor substrate and over its surface, bump electrodes are formed. Then, the bump electrodes formed on the surface and the glass substrate are coupled via an anisotropic conductive film. At this time, positioning is carried out in order to couple with high precision the bump electrodes formed over the semiconductor chip and the wirings formed over the glass substrate. For the positioning, a mark called alignment is formed on the semiconductor chip and it is possible to detect the position of the semiconductor chip with high precision by recognizing the alignment mark. For example, the cross-shaped mark is formed by a metal film in the same layer as that of the uppermost wiring and the alignment mark has a structure in which the cross-shaped mark is formed in the square background region having a side of about 150 μm. The detection of the position of the semiconductor chip is carried out by recognizing the position of the alignment mark with a camera, in which the cross-shaped mark is recognized by utilizing the difference in contrast between the background region and the cross-shaped mark.

However, the difference in contrast between the cross-shaped mark and the background region is sensitively affected by the material of the metal film constituting the mark and the film thickness of the interlayer insulating film. Consequently, the difference in contrast between the mark and the background region is not even between different semiconductor wafers or between chip regions of the same semiconductor wafer due to the variations in the manufacturing process of the semiconductor device and there arises a problem that the precision of detecting a mark is degraded.

An object of the present invention is to provide a technique capable of positioning of a semiconductor chip and a mounting substrate by improving the visibility of an alignment mark.

The above and further objects and novel features of the invention will more fully appear from the following detailed description in this specification and the accompanying drawings.

Among the preferred embodiments of the invention which will be disclosed herein, the typical ones will be briefly outlined below.

A semiconductor device according to a typical embodiment comprises a semiconductor chip and the semiconductor chip includes an alignment mark formation region in which an alignment mark used for positioning when mounting the semiconductor chip on a mounting substrate and an integrated circuit formation region in which an integrated circuit is formed. In this case, the alignment mark formed in the alignment mark formation region has (a) a mark region in which a mark is formed and (b) a background region that surrounds the mark region. On the other hand, in the integrated circuit formation region, (c) a plurality of element isolation regions formed over a semiconductor substrate, (d) a MISFET formed in an active region partitioned by the element isolation regions, and (e) wirings formed over the semiconductor substrate as well as over the MISFET are formed. The wirings are formed across a plurality of layers and the uppermost layer wiring among the wirings and the alignment mark are formed in the same layer. Here, the embodiment is characterized in that a first pattern is formed in the lower layer of the background region of the alignment mark and the first pattern is formed in the same layer as that of the wiring in one layer formed in the lower layer than the uppermost layer wiring in the integrated circuit formation region.

A method of manufacturing a semiconductor device according to a typical embodiment relates to a method of manufacturing a semiconductor device having (a) an alignment mark formation region in which an alignment mark used for positioning when mounting a semiconductor chip on a mounting substrate is formed and an integrated circuit formation region in which an integrated circuit is formed, the alignment mark including a mark region in which a mark is formed and a background region that surrounds the mark region. The method of manufacturing a semiconductor device includes the steps of (b) forming a plurality of element isolation regions in the integrated circuit formation region of a semiconductor substrate and (c) forming a MISFET in an active region partitioned by the element isolation regions. The method further includes the steps of (d) forming wirings in the integrated circuit formation region as well as over the MISFET and (e) forming an uppermost layer wiring in the integrated circuit formation region and forming the alignment mark in the same layer as that of the uppermost layer wiring in the alignment mark formation region. Here, the step (d) is characterized by forming a first pattern formed in the same layer as that of the wiring also in the lower layer of the background region in the alignment mark formation region.

The effect brought about by a typical embodiment of the inventions disclosed in the present application will be briefly described as follows.

According to a typical embodiment, it is possible to carry out positioning of a semiconductor chip and a mounting substrate by improving visibility of an alignment mark.

BRIEF DESCRIPTION OF THE DRAWINGS

FIG. 9 is a diagram in which FIG. 7 and FIG. 8 are overlapped.

FIG. 33 is a diagram in which FIG. 31 and FIG. 32 are overlapped.

DETAILED DESCRIPTION OF THE PREFERRED EMBODIMENTS

Figure 1:
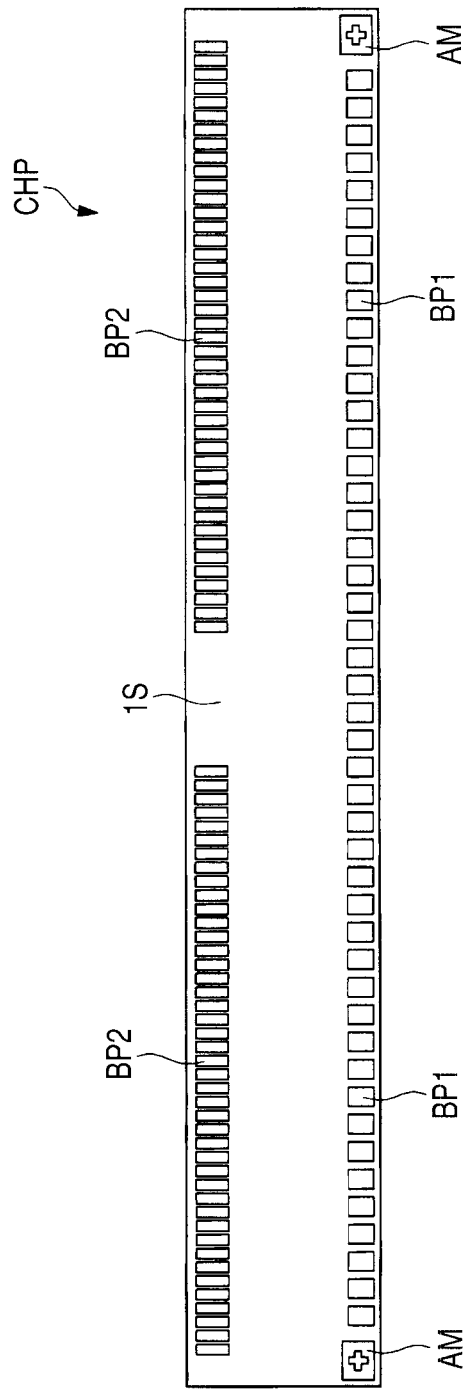
FIG. 1 is a plan view showing a configuration of a semiconductor chip in a first embodiment of the present invention.

In the following embodiments, when necessary for the sake of convenience, description will be given by dividing an embodiment into a plurality of sections or embodiments, however, except when explicitly stated in particular, the sections or embodiments are not those having nothing to do with each other but one has a relationship with another or all the rest as a variation, detail, supplementary description, etc.

When the number of elements etc. (including the number of items, numerical value, quantity, range, etc.) is referred to in the following embodiments, except when explicitly stated in particular or when the number is apparently limited to a specific number in principle, the number is not limited to the specific number but may be greater or less than that.

Further, it is needless to say that, in the following embodiments, except when explicitly stated in particular or when apparently indispensable in principle, the components (including elementary steps) are not necessarily indispensable.

Similarly, it is assumed that, in the following embodiments, when the shapes, positional relationships, etc., of the components etc. are referred to, except when explicitly stated or when they can apparently be thought otherwise in principle, those substantially similar to or resembling the shapes etc. are also included. This also applies to the above-mentioned numerical values and ranges.

In all of the drawings for explaining the embodiments, the same parts are assigned the same symbols as a rule and its duplicated description will be omitted. In order to make the drawing easier-to-see, even a plan view may be hatched.

First Embodiment

FIG. 1 is a plan view showing a configuration of a semiconductor chip CHP (semiconductor device) in a first embodiment. The semiconductor chip CHP in the first embodiment is an LCD driver. In FIG. 1, the semiconductor chip CHP has a semiconductor substrate 1S formed into, for example, an elongated oblong shape (rectangular shape) and over its main surface, an LCD driver to drive, for example, a liquid crystal display device is formed. The LCD driver has a function to control the orientation of the liquid crystal molecule by supplying a voltage to each pixel of the cell array constituting the LCD and comprises a gate drive circuit, a source drive circuit, a liquid crystal drive circuit, a graphic RAM (Random Access Memory), a peripheral circuit, etc. These functions are realized by semiconductor devices and wirings formed on the semiconductor substrate 1S. First, a surface configuration of the semiconductor chip CHP will be described.

The semiconductor chip CHP has a rectangular shape with a pair of short sides and a pair of long sides and along one of the pair of long sides (the lower side in FIG. 1), bump electrodes BP1 are arranged. These bump electrodes BP1 are arranged on a straight line. The bump electrode BP1 functions as an external connection terminal that couples to an integrated circuit (LCD driver) comprising semiconductor devices and wirings formed inside the semiconductor chip CHP. In particular, the bump electrode BP1 is the one for a digital input signal or an analog input signal.

Next, along the other long side of the pair of long sides (the upper side in FIG. 1), bump electrodes BP2 are arranged. These bump electrodes BP2 are also arranged on a straight line along the long side, however, the arrangement density of the bump electrodes BP2 is higher than that of the bump electrodes BP1. That is, the bump electrodes BP1 and the bump electrodes BP2 are formed along the long sides opposing each other of the semiconductor substrate 1S and the number of bump electrodes BP2 is larger than that of bump electrodes BP1. These bump electrodes BP2 also function as an external connection terminal that couples the integrated circuit formed inside the semiconductor substrate 1S and the outside. In particular, the bump electrode BP2 is the one for an output signal from the LCD driver.

As described above, along the pair of long sides constituting the periphery of the semiconductor chip CHP, the bump electrodes BP1 and the bump electrodes BP2 are formed. In this case, because the number of bump electrodes BP2 is larger compared to that of bump electrodes BP1, the arrangement density of the bump electrodes BP2 is higher than that of the bump electrodes BP1. This is because while the bump electrode BP1 is the one for an input signal input to the LCD driver, the bump electrode BP2 is the one for an output signal output from the LCD driver. That is, the input signal input to the LCD driver is serial data, and therefore, the number of bump electrodes BP1, which are an external connection terminal, becomes not so large. In contrast to this, the output signal output from the LCD driver is parallel data, and therefore, the number of bump electrodes BP2, which are an external connection terminal, becomes large. That is, the bump electrode BP2 for an output signal is provided for each cell (pixel) constituting a liquid crystal element, and therefore, the number of bump electrodes BP2 corresponding to the number of cells is necessary. As a result, the number of bump electrodes BP2 for an output signal is larger compared to the number of bump electrodes BP1 for an input signal. Consequently, the number of bump electrodes BP2 is increased larger than the number of bump electrodes BP1.

In FIG. 1, the bump electrodes BP1 and the bump electrodes BP2 are arranged along the pair of long sides constituting the semiconductor chip CHP, however, it may also be possible to arrange bump electrodes along the pair of short sides besides the pair of long sides. In the first embodiment, the bump electrodes BP2 for an output signal are arranged in one row, however, it is also possible to arrange them in two rows in a staggered manner. As described above, the number of bump electrodes BP2 for an output signal may become tremendously larger compared to the number of bump electrodes BP1 for an input signal, and therefore, there may be the case where they cannot be arranged in one row even if they are arranged densely on one straight line. In such a case, it is possible to arrange the many bump electrodes BP2 for an output signal by arranging them in two rows.

Subsequently, as shown in FIG. 1, on the semiconductor chip CHP, an alignment mark AM for positioning is formed. For example, the alignment mark AM is formed in the number of two on both ends of the long side along which the bump electrodes BP1 for an input signal are arranged on one straight line. The alignment mark is used for positioning. Specifically, the alignment mark AM is used not for positioning in the photolithography technique but for positioning when mounting the semiconductor chip CHP over a glass substrate. That is, the semiconductor chip CHP, which is an LCD driver, is mounted over the glass substrate constituting a liquid crystal display device. In this case, the semiconductor chip CHP is mounted in the glass substrate by coupling the bump electrodes BP1, BP2 formed in the semiconductor chip CHP to electrodes (ITO electrodes, transparent electrodes) formed over the glass substrate via an anisotropic conductive film. The distances between the bump electrodes BP1 and the bump electrodes BP2 are very small and the electrodes provided in correspondence with the bump electrodes BP1 and the bump electrodes BP2 are also arranged very densely. As a result, if the mounting position of the semiconductor chip CHP shifts, if slightly, it is no longer possible to correctly couple the bump electrodes BP1 and BP2 to the electrodes over the glass substrate and there is a possibility that the bump electrodes BP1 and BP2 come into contact also with the neighboring electrodes, causing a short circuit failure. Consequently, it can be seen that the bump electrodes BP1 and BP2 formed over the semiconductor chip CHP and the electrodes formed over the glass substrate need to be positioned accurately. Therefore, in order to recognize the position of the semiconductor chip CHP accurately, the alignment mark AM is provided. By recognizing the alignment mark AM with a camera, it is possible to obtain the coordinates of the accurate position of the semiconductor chip CHP. As a result, it is possible to arrange the semiconductor chip CHP with high precision over the glass substrate by coupling the bump electrodes BP1, BP2 of the semiconductor chip CHP and the electrodes of the glass substrate while recognizing the alignment mark AM with a camera.

Figure 2:
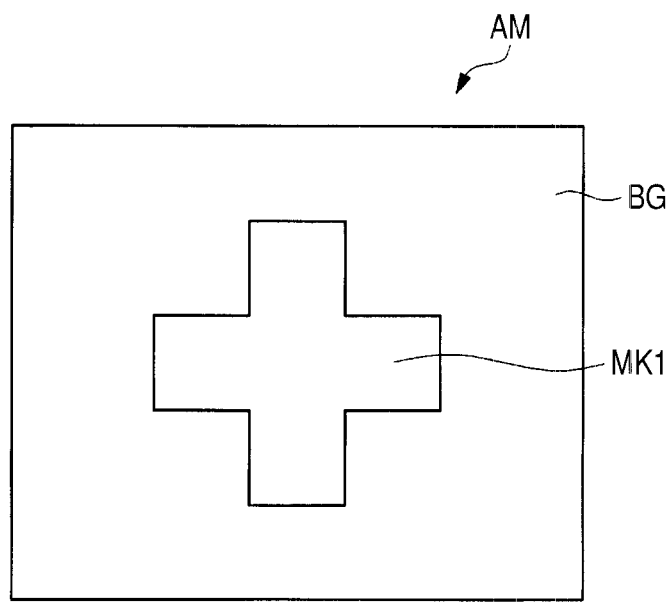
FIG. 2 is a plan view showing an example of an alignment mark.

In the following, a configuration of the alignment mark AM formed over the semiconductor chip CHP will be described. FIG. 2 is a plan view showing a configuration example of the alignment mark AM in the first embodiment. As shown in FIG. 2, the alignment mark AM has a shape in which a cross-shaped mark MK1 is formed in the center of a square background region BG. The background region BG is a square region with a side length of, for example, about 150 μm and made of, for example, an insulating film such as a silicon oxide film. On the other hand, the cross-shaped mark MK1, which is formed inside the background region BG, is made of, for example, a metal film. By making up the background region BG and the mark MK1 by different materials in this manner, when the alignment mark AM is irradiated with light, the reflectivity of the light reflected from the background region BG is different from that of the light reflected from the mark MK1. Since the reflectivity of the light reflected from the background region BG is different from that of the mark MK1, there is generated a difference in contrast between the background region BG and the mark MK1 and therefore the mark MK1 can be recognized with a camera. In general, the reflectivity of a metal film such as an aluminum film is higher than that of an insulating film such as a silicon oxide film, and therefore, the bright mark MK1 emerges over the dark background region BG and thus the mark MK1 can be recognized.

Figure 3:
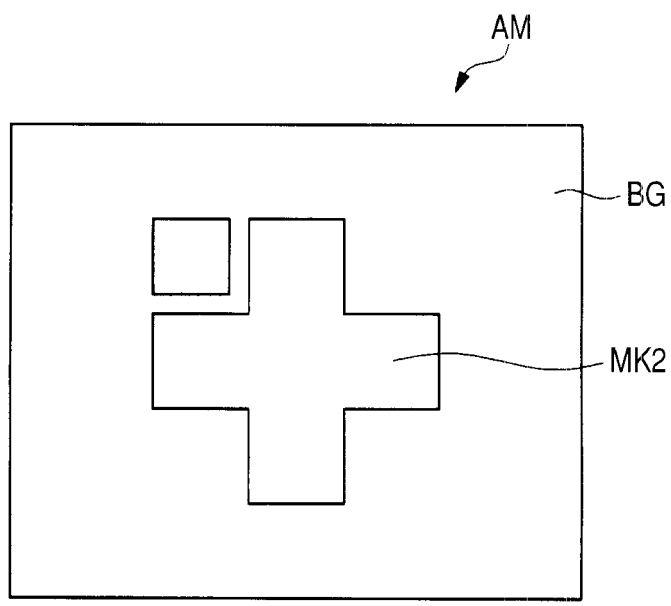
FIG. 3 is a plan view showing an example of the alignment mark.
Figure 4:
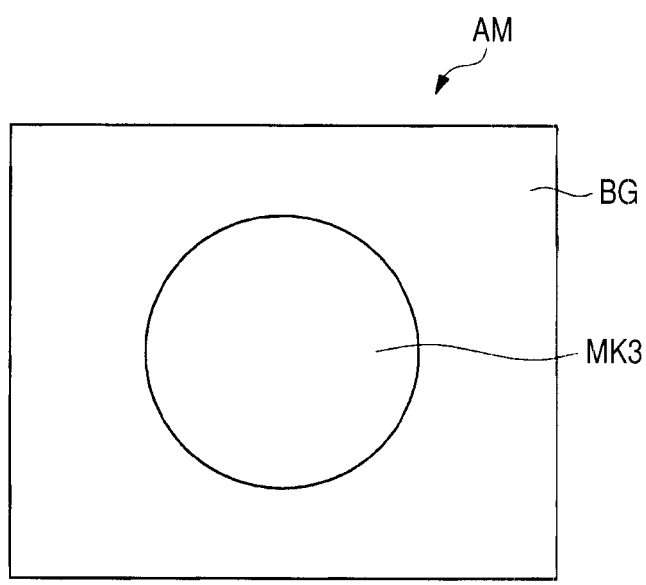
FIG. 4 is a plan view showing an example of the alignment mark.

FIG. 2 shows the shape of a cross as an example of the mark MK1 constituting the alignment mark AM, however, this is not limited and there can be thought various mark shapes. For example, FIG. 3 is a plan view showing another configuration example of the alignment mark AM. As shown in FIG. 3, a mark MK2 is formed within the background region BG and the shape of the mark MK2 is composed of a cross and a square provided in the upper left of the cross. Further, FIG. 4 is a plan view showing another configuration example of the alignment mark AM. In the alignment mark AM shown in FIG. 4, a circular mark MK3 is formed in the background region BG. As described above, various shapes of a mark can be thought, such as a cross, a modification of a cross, and a circular shape, as shown in FIG. 2 to FIG. 4, and it is possible to use any shape for the positioning of the semiconductor chip CHP.

As described above, the alignment mark AM is recognized by the difference in contrast between the background region BG and the mark MK1, however, the present inventors have found that with the conventional alignment mark AM, the recognition of the alignment mark AM is impeded resulting from the unevenness of the difference in contrast between the background region BG and the mark MK1. That is, in the conventional alignment mark AM, there is a remarkable amount of light reflected from the background region, and therefore, the difference in contrast between the background region BG and the mark MK1 becomes smaller, making it difficult to sufficiently recognize the mark MK1 with a camera. Specifically, it has been revealed that the light reflected from the background region BG sensitively depends on the film thickness of an insulating film constituting the background region BG. Owing to the variations in the manufacture process, there is a possibility that variations in the film thickness of the insulating film constituting the background region BG of the alignment mark AM are caused in different semiconductors wafer or in different chip regions of the same semiconductor wafer. In this case, in the semiconductor chip CHP obtained from a different semiconductor wafer or from a different chip region of the same semiconductor wafer, the difference in contrast between the background region BG and the mark MK1 is not even and variations are caused resulting from the difference in the film thickness of the insulating film constituting the background region BG. The situation has been brought about in which, for example, in one of the semiconductor chips CHP, the difference in contrast between the background region BG and the mark MK1 of the alignment mark AM becomes large and the alignment mark can be recognized with a camera, however, on the other hand, in another of the semiconductor chips CHP, the difference in contrast between the background region BG and the mark MK1 of the alignment mark AM becomes small and it is difficult to recognize the alignment mark AM with a camera. That is, with the conventional alignment mark AM, the difference in contrast between the background region BG and the mark MK1 differs from semiconductor chip CHP to semiconductor chip CHP, resulting in the reduction of the visibility of the alignment mark AM. Therefore, an object of the first embodiment is to provide a technique capable of improving the visibility of the alignment mark AM in all of the semiconductor chips CHP even if the difference in contrast between the background region BG and the mark MK1 varies resulting from, for example, the difference in the film thickness of the insulating film constituting the background region BG of the alignment mark AM. In order to achieve this object, in the first embodiment, it is basically intended that the visibility of the alignment mark AM can be improved even if the difference in contrast between the background region BG and the mark MK1 of the alignment mark AM varies. Specifically, in the first embodiment, a dot pattern is formed in the lower layer of the background region BG of the alignment mark AM. Consequently, it is possible to reduce the proportion of light reflected from the background region BG by causing the functions to diffract, scatter, and shut off the light that has entered the background region BG to exhibit their abilities. Due to the effect of reduction in reflected light by the dot pattern provided in the lower layer of the background region BG, the difference in contrast between the background region BG and the mark MK1 is improved. In other words, in the first embodiment, by adopting a configuration in which the light reflected from the background region BG can be reduced sufficiently, it is possible to maintain a difference in contrast sufficient for a camera to recognize the difference in all of the semiconductor chips CHP even if the difference in contrast between the background region BG and the mark MK1 varies resulting from, for example, the difference in the film thickness of the insulating film constituting the background region BG. That is, even if the difference in contrast between the background region BG and the mark MK1 varies in the individual semiconductor chips, in the first embodiment, the light reflected from the background region BG can be reduced absolutely, and therefore, it is possible to obtain a difference in contrast sufficiently satisfactory for the recognition with a camera. The first embodiment is based on the technical concept from the standpoint that the visibility of the alignment mark AM is improved without the influence of the variations in the difference in contrast by reducing the light reflected from the background region BG absolutely even if the difference in contrast varies in the individual semiconductor chips CHP, rather than that the variations in the difference in contrast in the individual semiconductor chips CHP are suppressed positively.

Figure 5:
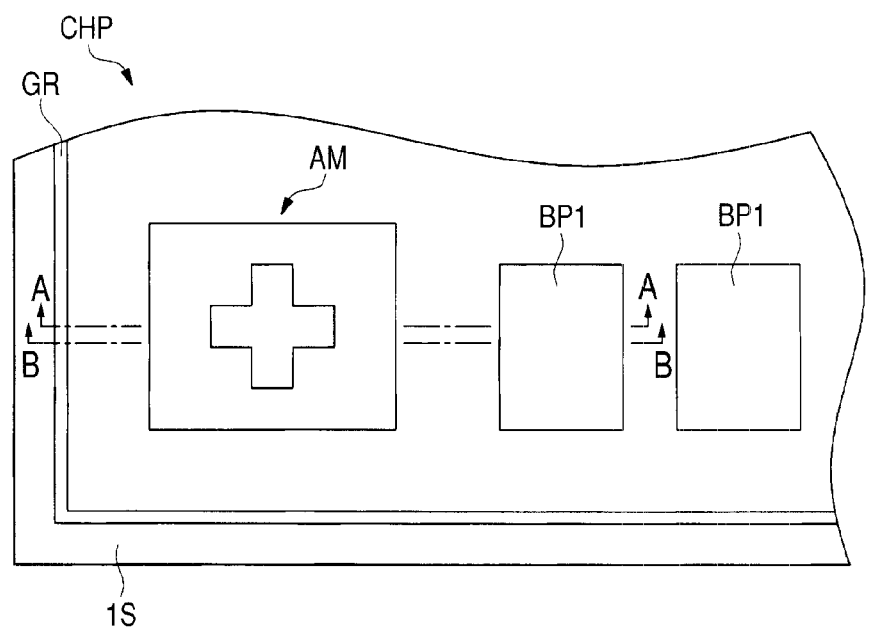
FIG. 5 is an enlarged diagram of part of the semiconductor chip.

The configuration of the alignment mark AM in the first embodiment will be described below in detail. FIG. 5 is an enlarged plan view of the vicinity of the alignment mark formation region of the semiconductor chip CHP in FIG. 1. In FIG. 5, a guard ring GR is formed so as to surround the outer edge part of the semiconductor chip CHP and in a corner within the guard ring GR, the alignment mark AM is formed. Then, beside the alignment mark AM, the bump electrodes BP1 for an input signal are arranged. Here, for the description of the characteristic configuration of the alignment mark AM in the first embodiment, section views are used, that is, for the description, a section view of the configuration cut by an A-A line in FIG. 5 and a section view cut by a B-B line in FIG. 5 are used. First, in order to explain the difference between the A-A line and the B-B line in FIG. 5, FIG. 6 shows which region of the alignment mark AM is cut by the respective lines using an enlarged plan view of the alignment mark AM in the first embodiment.

Figure 6:
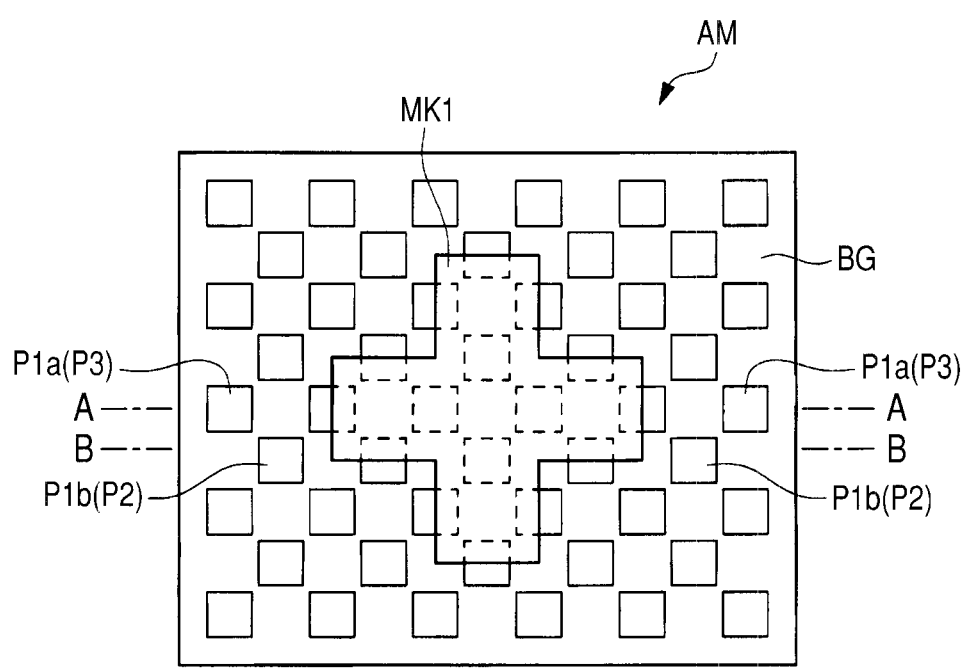
FIG. 6 is a diagram showing a configuration of the alignment mark.

FIG. 6 is a plan view showing the configuration of the alignment mark AM in the first embodiment. As shown in FIG. 6, in the alignment mark AM in the first embodiment, the cross-shaped mark MK1 is formed in the center of the rectangular background region BG. Then, in the lower layer of the background region BG including the lower layer of the mark MK1, a dot pattern is formed. The dot pattern shown in FIG. 6 is not in the same layer as that of the mark MK1 but is formed across the lower layer of the mark MK1 and the lower layer of the background region BG. The dot pattern shown in FIG. 6 is not formed in the same layer but shown as a pattern formed by overlapping in a planar manner those formed across two or more layers. For example, the dot pattern crossed by the A-A line in FIG. 6 shows a pattern P1a, and further showing a pattern P3 also, which is a planar pattern similar to the pattern P1a although formed in a different layer from that of the pattern P1a. That is, the A-A line in FIG. 6 is a line that cuts the arrangement region of the pattern P1a and the pattern P3 constituting the dot pattern. On the other hand, the dot pattern crossed by the B-B line in FIG. 6 shows a pattern P1b, and further showing a pattern P2 also, which is a planar pattern similar to the pattern P1b although formed in a different layer from that of the pattern P1b. That is, the B-B line in FIG. 6 is a line that cuts the arrangement region of the pattern P1b and the pattern P2 constituting the dot pattern. In this manner, the dot pattern formed in the alignment mark AM in FIG. 6 is configured by alternately arranging the patterns (P1a and P3) on the A-A line and the patterns (P1b and P2) on the B-B line.

Figure 7:
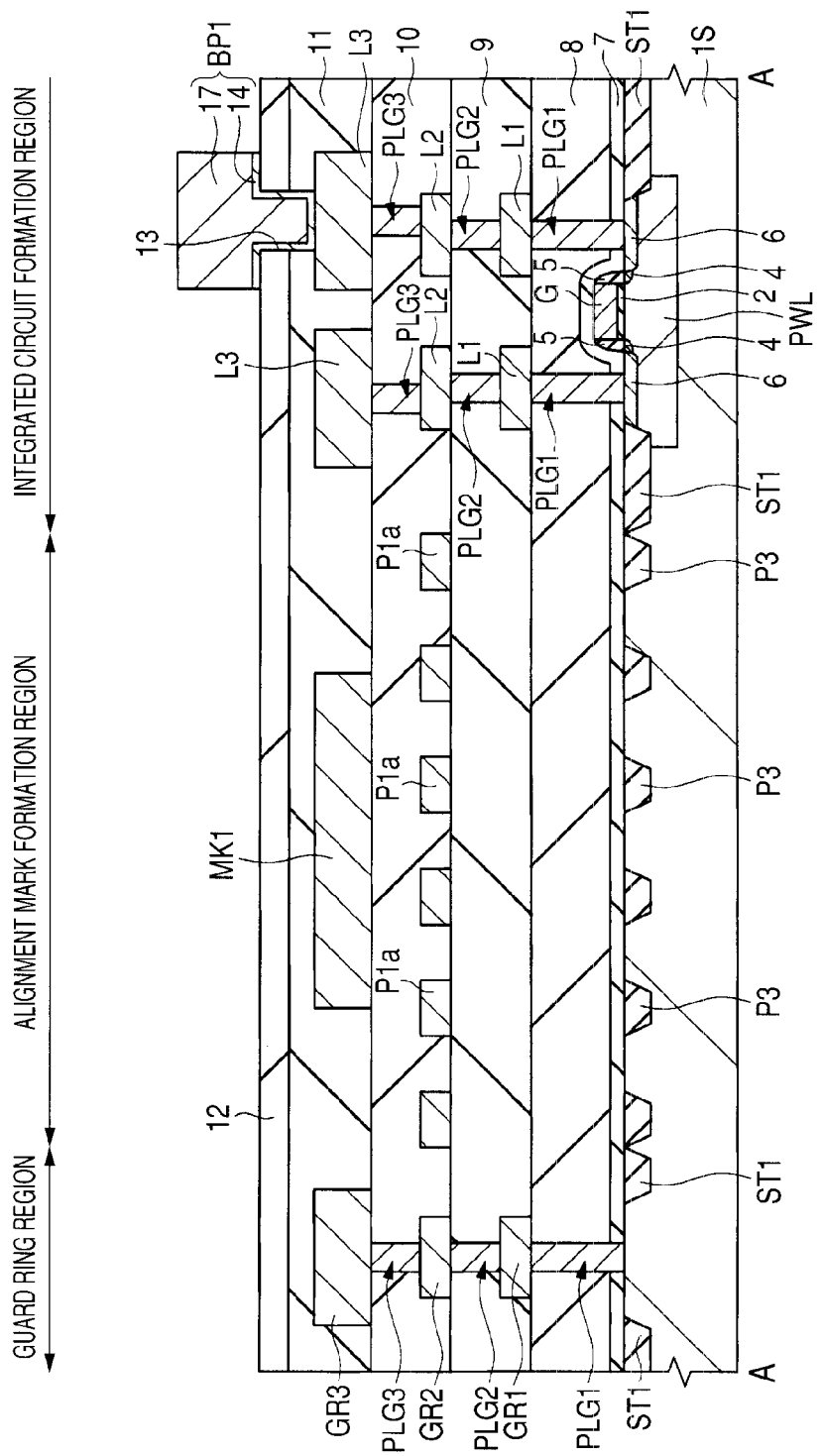
FIG. 7 is a section view cut along an A-A line in FIG. 5 and FIG. 6.

Based on such a configuration, a section view cut by the A-A line in FIG. 5 and FIG. 6 is shown in FIG. 7. As shown in FIG. 7, in the section cut by the A-A line, a guard ring region, an alignment mark region, and an integrated circuit formation region are shown schematically. In the following, a structure formed in each region will be described.

First, a guard ring structure formed in the guard ring region will be described. The guard ring structure is formed to prevent the invasion of water and impurities into the semiconductor chip CHP. Over the main surface (element formation surface) of the semiconductor substrate 1S, an element isolation region STI is formed and an active region is partitioned between the two element isolation regions STI. Over the main surface of the semiconductor substrate 1S over which the element isolation region STI is formed, a laminated film of a silicon nitride film 7 and a silicon oxide film 8 is formed and a plug PLG1 is formed so as to penetrate through the laminated film. In the plug PLG1, for example, a titanium/titanium nitride film, which is a barrier conductive film, is formed over the surface of its hole and over the titanium/titanium nitride film, a tungsten film is formed. That is, the plug PLG1 is formed by filling its hole with a titanium/titanium nitride film and a tungsten film. Then, over an interlayer insulating film made up of the silicon nitride film 7 and the silicon oxide film 8, a wiring GR1 is formed and the wiring GR1 is electrically coupled with the plug PLG1. Next, over the silicon oxide film 8 as well as over the wiring GR1, a silicon oxide film 9 is formed and in the silicon oxide film 9, a plug PLG2 that penetrates through the silicon oxide film 9 and is coupled with the wiring GR1 is formed. Similar to the plug PLG1, the plug PLG2 is also formed by filling its hole with a titanium/titanium nitride film and a tungsten film. Further, over the silicon oxide film 9 in which the plug PLG2 is formed, a wiring GR2 is formed and a silicon oxide film 10 is formed so as to cover the wiring GR2. The wiring GR2 is electrically coupled with the plug PLG2 that penetrates through the silicon oxide film 9. Then, in the silicon oxide film 10, a plug PLG3 that penetrates through the silicon oxide film 10 is formed and over the silicon oxide film 10 in which the plug PLG3 is formed, a wiring GR3 is formed. The plug PLG3 also has the same structure as that of the plug PLG1 and plug PLG2 and is formed by filling its hole with a titanium/titanium nitride film and a tungsten film. Over the silicon oxide film 10 as well as over the wiring GR3, a silicon oxide film 11 and a silicon nitride film 12 are formed. The wirings GR1, GR2 and GR3 are formed by, for example, an aluminum alloy film. As described above, the guard ring structure is formed in the guard ring region. That is, by forming a protective wall structure by the plugs PLG1 to PLG3 and the wirings GR1 to GR3, the invasion of water and impurities into the alignment mark formation region and the integrated circuit formation region formed on the inside than the guard ring region is prevented.

Subsequently, a transistor and a wiring formed in the integrated circuit formation region will be described. In FIG. 7, an n-channel type MISFET (Metal Insulator Semiconductor Field Effect Transistor) constituting part of the integrated circuit is shown. Here, the n-channel type MISFET and a wiring will be described. Although not shown schematically in FIG. 7, a p-channel type MISFET etc. is also formed in addition to the n-channel type MISFET in the integrated circuit formation region.

Over the main surface of the semiconductor substrate 1S, a plurality of the element isolation regions STI is formed and a region partitioned by the element isolation region STI is an active region. The element isolation region STI is formed by, for example, embedding a silicon oxide film in a groove formed in the semiconductor substrate 1S.

In the active region partitioned by the element isolation region STI, a p-type well PWL is formed. The p-type well PWL is formed by introducing p-type impurities such as boron (B), into the semiconductor substrate 1S. The n-channel type MISFET is formed over the p-type well PWL. The configuration of the n-channel type MISFET will be described.

In the n-channel type MISFET, for example, a gate insulating film 2 made of a very thin silicon oxide film is formed over the p-type well PWL and a gate electrode G is formed over the gate insulating film 2. The gate electrode G is formed by, for example, a polysilicon film. The gate electrode G may have a laminated structure of a polysilicon film and a silicide film by forming a silicide film such as a cobalt silicide film, over the surface of the polysilicon film constituting the gate electrode G. In this case, the resistance of the gate electrode G can be reduced by the silicide film.

On the sidewalls on both sides of the gate electrode G, a sidewall 5 made of, for example, a silicon oxide film is formed and in the p-type well PWL immediately under the sidewall 5, a low-concentration n-type impurity diffusion region 4 is formed. The low-concentration n-type impurity diffusion region 4 is also called an extension region and formed aligned with the gate electrode G. The low-concentration n-type impurity diffusion region 4 is a semiconductor region formed by introducing n-type impurities such as phosphorus (P) and arsenic (As) into the semiconductor substrate 1S. Subsequently, on the outside of the low-concentration n-type impurity diffusion region in the p-type well PWL, a high-concentration n-type impurity diffusion region 6 is formed. The high-concentration n-type impurity diffusion region 6 is also a semiconductor region into which n-type impurities such as phosphorus and arsenic are introduced and the concentration of the introduced n-type impurities is higher than that of the low-concentration n-type impurity diffusion region 4. The high-concentration n-type impurity diffusion region 6 is formed aligned with the sidewall 5. The source region and the drain region are formed by these low-concentration n-type impurity diffusion region 4 and high-concentration n-type impurity diffusion region 6. That is, by forming each of the source region and the drain region by combining the low-concentration n-type impurity diffusion region 4 and the high-concentration n-type impurity diffusion region 6, an LDD (Lightly Doped Drain) structure capable of relaxing the concentration of electric field immediately under the end part of the gate electrode can be obtained. In this manner, the n-channel type MISFET is formed.

Subsequently, the wiring structure formed in the upper layer of the n-channel type MISFET will be described. As shown in FIG. 7, an interlayer insulating film made up of the silicon nitride film 7 and the silicon oxide film 8 is formed so as to cover the n-channel type MISFET. In the interlayer insulating film, the plug PLG1 that reaches the source region or the drain region of the n-channel type MISFET is formed. The plug PLG1 has the same structure as that of those formed in the guard ring region and is formed by embedding a titanium/titanium nitride film and a tungsten film in the hole. Then, over the plug PLG1, for example, a first layer wiring L1 made of an aluminum alloy film is formed and the first layer wiring L1 and the plug PLG1 are electrically coupled. Further, over the silicon oxide film 8 in which the first layer wiring L1 is formed, the silicon oxide film 9 is formed and the plug PLG2 that penetrates through the silicon oxide film 9 and reaches the first layer wiring L1 is formed. Similar to the plug PLG1, the plug PLG2 is also formed by embedding a titanium/titanium nitride film and a tungsten film in the hole.

Next, over the silicon oxide film 9 in which the plug PLG2 is formed, for example, a second layer wiring L2 made of an aluminum alloy film is formed and the silicon oxide film 10 is formed so as to cover the second layer wiring L2. In the silicon oxide film 10, the plug PLG3 that penetrates through the silicon oxide film 10 and is coupled to the second layer wiring L2 is formed and over the plug PLG3, for example, a third layer wiring L3 made of an aluminum alloy film is formed. Similar to the plug PLG1 and the plug PLG2, the plug PLG3 is also formed by embedding a titanium/titanium nitride film and a tungsten film in the hole.

Over the silicon oxide film 10 as well as over the third layer wiring L3, a laminated film made up of the silicon oxide film 11 and the silicon nitride film 12 is formed. In the laminated film, an opening 13 that penetrates through the laminated film and exposes the surface of the third layer wiring L3 is formed. From the interior of the opening 13 onto the silicon nitride film 12, a laminated film of a UBM (Under Bump Metal) film 14 and gold film 17 is formed and the bump electrode BP1 made up of the UBM film 14 and the gold film 17 is formed. In this manner, the n-channel type MISFET and multilayer wirings are formed in part of the integrated circuit formation region.

Next, the alignment mark formation region, which is the characteristic region of the first embodiment will be described. As shown in FIG. 7, in the alignment mark formation region, over the main surface of the semiconductor substrate 1S, the pattern P3 is formed. The pattern P3 constitutes part of the dot pattern in FIG. 6. The pattern P3 has the same structure as that of the element isolation region STI and is formed by embedding a silicon oxide film in the groove formed in the semiconductor substrate 1S. The pattern 3 is formed in the same layer as that of the element isolation region STI formed in the integrated circuit formation region and one of the patterns P3 is miniaturized to a size about that of visible light. Specifically, the size of the groove that constitutes the pattern P3 is, for example, about 400 to 800 nm. The pattern Ps is formed across the entire alignment mark formation region. That is, the pattern P3 is formed not only in the background region in which the mark MK1 is not formed but also in the lower layer in which the mark MK1 is formed in the alignment mark formation region.

Then, in the upper layer of the pattern. P3, a laminated film made up of the silicon nitride film 7 and the silicon oxide film 8 is formed and over the laminated film, the silicon oxide film 9 is formed. Over the silicon oxide film 9, the pattern P1a is formed. The pattern P1a constitutes part of the dot pattern in FIG. 6. The pattern P1a is formed in the same layer as that of the second layer wiring L2 formed in the integrated circuit formation region and is formed by an aluminum alloy film similar to the second layer wiring L2. One of the patterns P1a is miniaturized to a size about that of visible light. Specifically, the size of the pattern P1a is, for example, about 400 to 800 nm. The pattern P1a is formed across the entire alignment mark formation region. That is, the pattern P1a is formed not only in the background region in which the mark MK1 is not formed but also in the lower layer in which the mark MK1 is formed in the alignment mark formation region. The pattern P1a formed in the same layer as that of the second layer wiring L2 is formed as a pattern that overlaps the pattern P3 formed in the same layer as that of the element isolation region STI in a planar manner.

Next, the silicon oxide film 10 is formed so as to cover the pattern P1a and over the silicon oxide film 10, the mark MK1 is formed. The mark MK1 is formed in the same layer as that of the third layer wiring L3 formed in the integrated circuit formation region and is formed by, for example, an aluminum alloy film. A laminated film made up of the silicon oxide film 11 and the silicon nitride film 12 is formed so as to cover the mark MK1. As described above, the mark MK1 is formed in the alignment mark formation region and in the lower layer of the mark MK1, the pattern P1a and the pattern P3 are formed.

One of the characteristics of the first embodiment is that the pattern P1a and the pattern P3 are formed in the lower layer of the mark MK1. By forming the pattern P1a and the pattern P3, the reflection of light can be reduced in the background region surrounding the mark MK1 in the alignment mark formation region. Consequently, almost all incident light is reflected from the mark MK1, however, the reflected light in the background at the periphery of the mark MK1 can be reduced and it is possible to increase the difference in contrast between the mark MK1 and the background region. As a result, the visibility of the mark MK1 can be improved and the positioning precision of the semiconductor chip can be improved. The mechanism capable of reducing reflected light in the background region by providing the pattern P1a and the pattern P3 will be described later.

Figure 8:
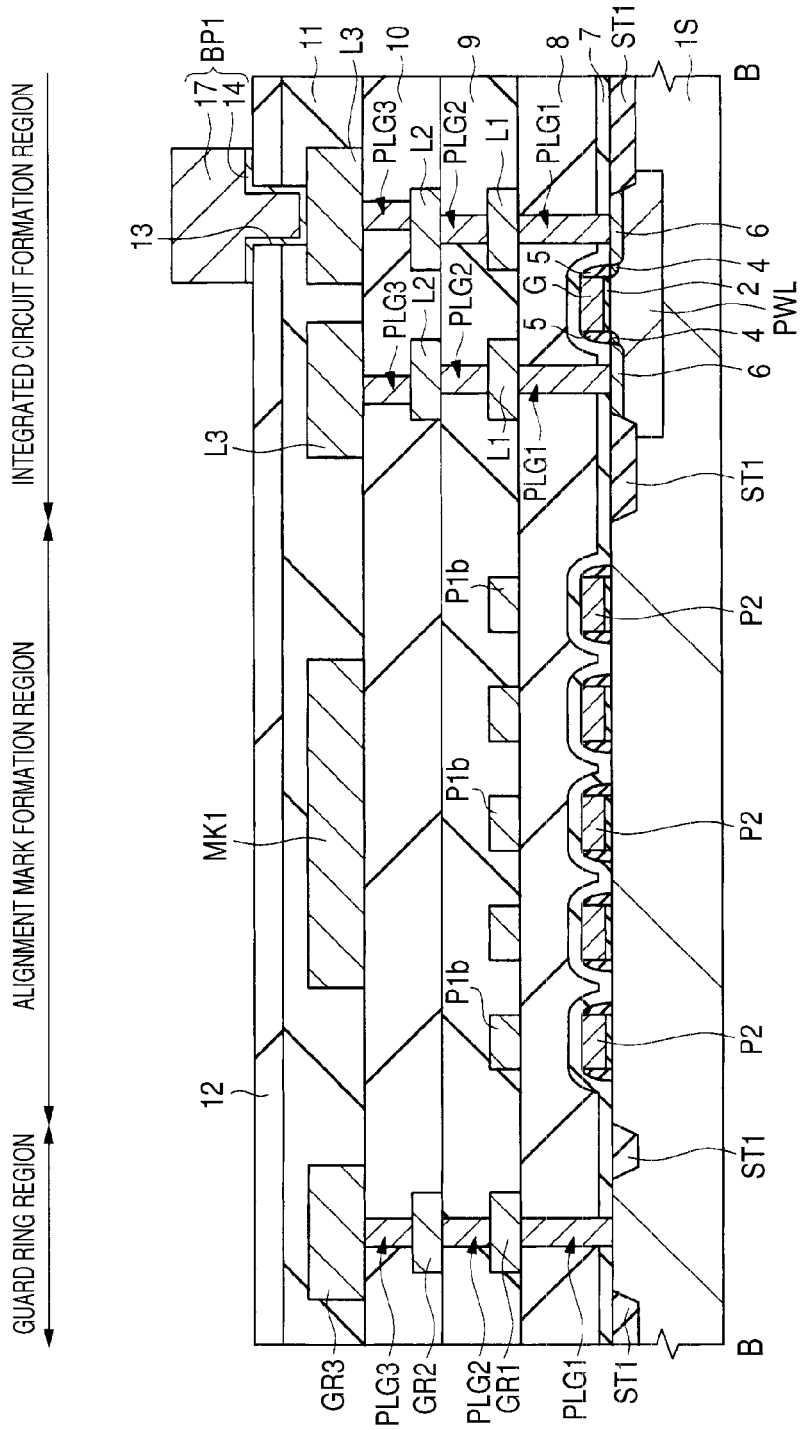
FIG. 8 is a section view cut along a B-B line in FIG. 5 and FIG. 6.

Next, FIG. 8 is a section view cut by the B-B line in FIG. 5 and FIG. 6. In FIG. 8, the configuration of the guard ring region and the integrated circuit formation region is the same as that in section view cut by the A-A line shown in FIG. 7, and therefore, its explanation is omitted. The alignment mark formation region, which is the characteristic configuration in FIG. 8, will be described as to points different from those in FIG. 7. The characteristic configuration in FIG. 8 is that the pattern P2 is formed over the main surface of the semiconductor substrate 1S. The pattern P2 is formed in the same layer as that of the gate electrode G formed in the integrated circuit formation region. Then, the pattern P2 is formed by a polysilicon film similar to the gate electrode G. One of the patterns P2 is miniaturized to a size about that of visible light. Specifically, the size of the pattern P2 is, for example, about 400 to 800 nm. The pattern P2 is formed across the entire alignment mark formation region. That is, the pattern P2 is formed not only in the background region in which the mark MK1 is not formed but also in the lower layer in which the mark MK1 is formed in the alignment mark formation region.

Subsequently, the characteristic configuration in FIG. 8 is one in which the pattern P1b is formed over the silicon oxide film 8. The pattern P1b is formed in the same layer as that of the first layer wiring L1 formed in the integrated circuit formation region and made up of an aluminum alloy film that is the same material as that of the first layer wiring One of the patterns P1b is miniaturized to a size about that of visible light. Specifically, the size of the pattern P1b is, for example, about 400 to 800 nm. The pattern P1b is formed across the entire alignment mark formation region. That is, the pattern P1b is formed not only in the background region in which the mark MK1 is not formed but also in the lower layer in which the mark MK1 is formed in the alignment mark formation region. The pattern P1b formed in the same layer as that of the first layer wiring L1 is formed as a pattern that overlaps the pattern P2 formed in the same layer as that of the gate electrode G in a planar manner.

As described above, in the first embodiment, the pattern P1a and the pattern P3 are formed in the lower layer of the mark MK1 in the alignment mark formation region as shown in the section view (FIG. 7) cut by the A-A line and the pattern P1b and the pattern P2 are formed in the lower layer of the mark MK1 in the alignment mark formation region as shown in the section view (FIG. 8) cut by the B-B line. Then, in the first embodiment, the patterns P1a, P1b, P2, and P3 are formed in different layers from one another, respectively.

Figure 9:
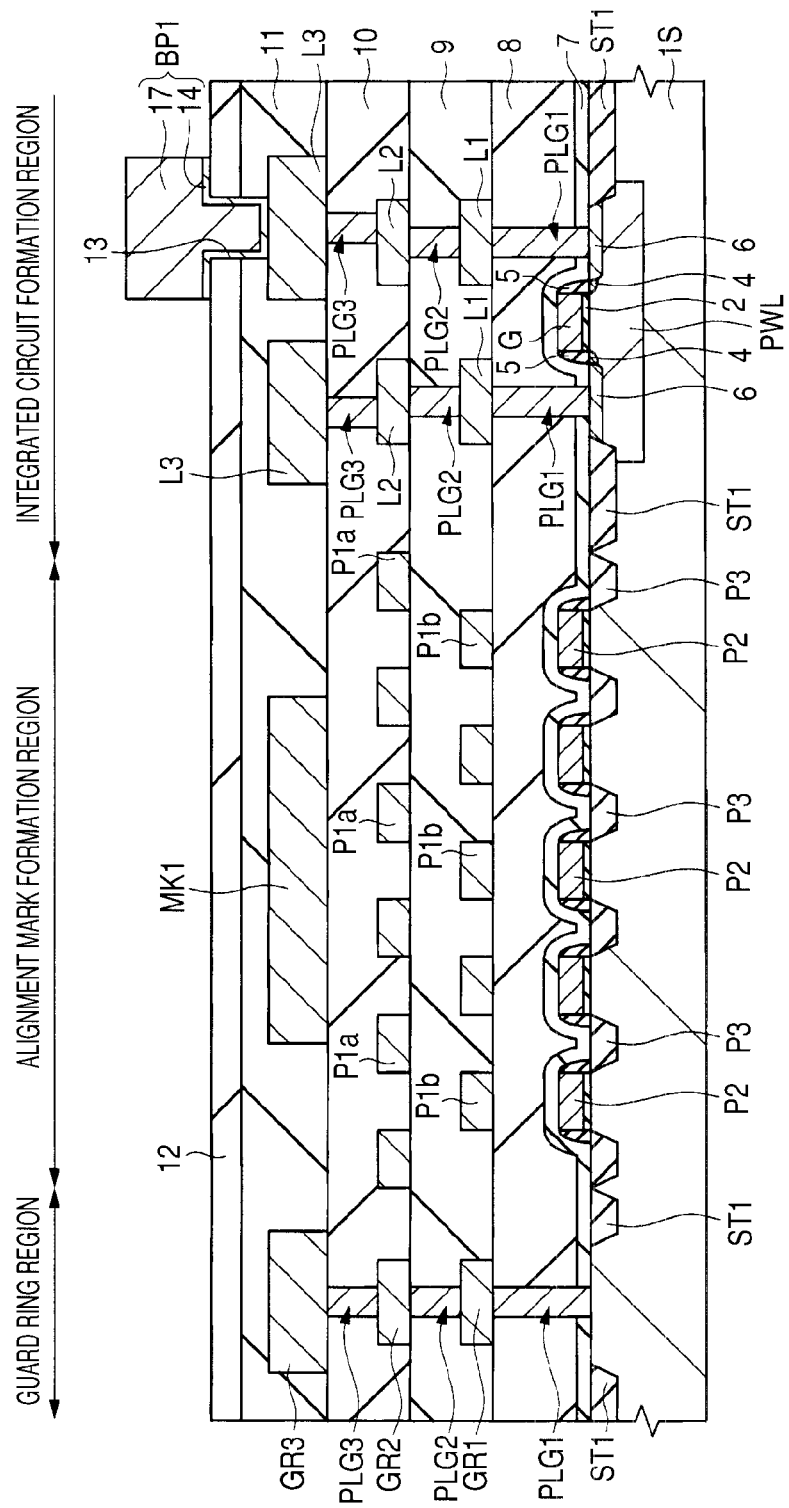

FIG. 9 is a diagram in which FIG. 7 and FIG. 8 are overlapped. From FIG. 9, the positional relationship between the mark MK1 in the alignment mark formation region and the patterns P1a, P1b, P2, and P3 formed in the lower layer of the background region surrounding the mark MK1. That is, the pattern P1a formed in the same layer as that of the second layer wiring L2 and the pattern P3 formed in the same layer as that of the element isolation region STI are identical from a planar standpoint, and therefore, the pattern P1a and the pattern P3 overlap each other when viewed in a planar perspective (refer to FIG. 6). Then, the pattern P1b formed in the same layer as that of the first layer wiring L1 and the pattern 2 formed in the same layer as that of the gate electrode G are identical from a planar standpoint and the pattern P1b and the pattern P2 overlap each other when viewed in a planar perspective (refer to FIG. 6). On the other hand, the pattern P1a and the pattern P1b are formed so as to be shifted from each other and the pattern P1a and the pattern P1b are arranged so as not to overlap each other in a planar manner. That is, the pattern P1a (pattern P3) shown in FIG. 7 and the pattern P1b (pattern P2) shown in FIG. 8 are arranged so as not to overlap each other in a planar manner. By arranging the patterns P1a, P1b, P2 and P3 in this manner, the dot pattern shown in FIG. 6 is formed.

Figure 10:
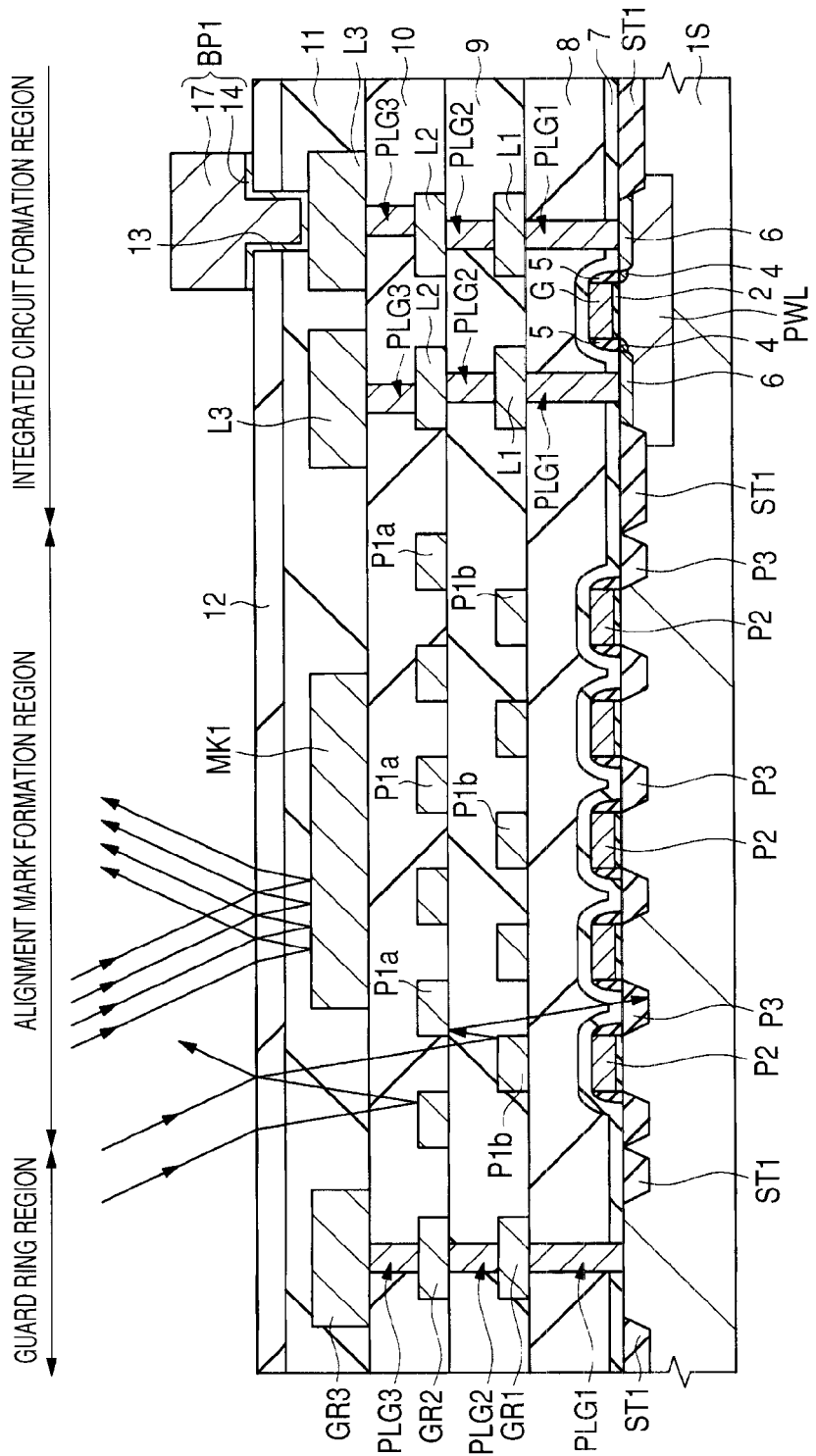
FIG. 10 is a diagram for illustrating a mechanism to improve visibility of the alignment mark.

Next, the mechanism capable of reducing light reflected from the background region by forming the patterns P1a, P1b, P2 and P3 in the lower layer of the mark formation region and the background region as in the first embodiment will be described with reference to FIG. 10.

First, a first mechanism capable of reducing reflected light from the background region will be described. In FIG. 10, if attention is focused on the pattern P1a, it can be seen that each pattern P1a is formed with a size of visible light and the patterns P1a are arranged at intervals of a size of visible light. The pattern P1a arranged in this manner has a function as a diffraction grating. A diffraction grating spreads light incident to the diffraction grating by diffraction and the light spread by diffraction is characterized by forming an interference pattern (including bright fringes and dark fringes). The spread by diffraction of the diffraction grating becomes greater as the interval of the pattern P1a becomes narrower. In the first embodiment, the interval of the pattern P1a is reduced to as small as a size of visible light and therefore the spread by diffraction is considerably great. As a result, for example, light incident to the alignment mark formation region formed in the semiconductor chip CHP enters the silicon nitride film 12 and the silicon oxide film 11 formed in the uppermost layer, however, the silicon nitride film 12 and the silicon oxide film 11 are almost transparent to visible light and therefore the incident light passes through the silicon nitride film 12 and the silicon oxide film 11 and enters the pattern P1a. The pattern P1a itself is made up of a metal film and therefore does not transmit the incident light but reflects it, however, the pattern P1a is arranged regularly at the interval of a size of visible light and therefore it functions as a diffraction grating. Since the size of the opening formed between the patterns P1a is the size of visible light, the effect of diffraction is magnified. As a result, the light reflected from the pattern P1a will spread considerably. This will reduce the amount of reflected light that enters a camera arranged in a fixed direction. On the other hand, light incident to the mark MK1 is reflected almost entirely because the mark MK1 itself is formed by a metal film. As a result, the difference between the amount of reflected light diffracted by the pattern P1a and the amount of light reflected by the mark MK1 becomes larger. This means that the amount of reflected light from the background region, which light enters the camera, reduces due to the diffraction effect by the pattern P1a and that the difference in contrast between the background region and the mark MK1 becomes larger. Consequently, the visibility of the mark MK1 with a camera is improved. As the result of the improvement of the visibility of the mark MK1 by such a first mechanism, it is made possible to grasp with high precision the position of the semiconductor chip CHP. In particular, in the first embodiment, in addition to the pattern P1a, the pattern P1b, the pattern P2, and the pattern P3 are formed and each pattern functions as a diffraction grating. Consequently, the spread by diffraction of light reflected from the background region becomes greater and the amount of reflection light that enters the camera from the background region further reduces and therefore a remarkable effect can be obtained that the difference in contrast between the mark MK1 and the background region can be made large sufficiently. Further, the light output from the diffraction grating interferes with each other. By this interference, an interference contrast pattern (including bright fringes and dark fringes) is formed. Consequently, by adjusting the position at which the camera is arranged so that a weak pattern (including dark fringes) of the contrast pattern by interference enters the camera, it is possible to further reduce the intensity of the light reflected from the background region. It can be seen that if the patterns P1a, P1b, P2 and P3 are provided in the lower layer of the background region as in the first embodiment, it is possible to reduce the amount of reflected light that enters the camera from the background region due to the effect of diffraction and interference of light.

Further, there exists a second mechanism capable of reducing the amount of reflected light from the background region by the patterns P1a, P1b, P2 and P3, in addition to the first mechanism that makes use of diffraction and interference of light as described above. This second mechanism will be described. The second mechanism is realized in a manner such that, on one hand, the pattern P1a and the pattern P1b formed in the wiring layer cut off the reflected light and, on the other hand, the pattern P2 and the pattern P3 formed in the lower layer of the wiring layer scatter light. Part of light incident to the pattern P1a formed in the same layer as that of the second layer wiring L2 is reflected from the pattern P1a and the rest passes through the opening of the pattern P1a (interval region of the pattern P1a) and reaches the lower layer. Then, part of the incident light that has passed through the pattern P1a is reflected from the pattern P1b and the rest passes through the pattern P1b. At this time, part of the light reflected from the pattern P1b is cut off by the pattern P1a arranged in the upper layer of the pattern P1b. Consequently, the reflected light output from the background region can be reduced. That is, the pattern P1a has a function to cut off part of the light that has once passed through the pattern P1a and is reflected from the pattern P1b. Further, the light that has passed through the pattern P1b is also reflected from the semiconductor substrate 1S, however, part of the light is cut off again by the pattern P1b or the pattern P1a. As described above, in the first embodiment, one of the characteristics is that the pattern P1a and the pattern P1b are provided in the wiring layer arranged in the middle of the mark MK1 and the semiconductor substrate 1S. By arranging the pattern P1a and the pattern P1b in the wiring layer, the effect of cutting off the light reflected in the lower layer of the respective patterns can be obtained. As a result that the output of light can be cut off by the pattern P1a and the pattern P1b, the amount of reflected light that enters the camera from the background region can be reduced. Further, by forming the pattern P1a and the pattern P1b in the plurality of layers constituting the wiring layer and by arranging the pattern P1a and the pattern P1b so that they do not overlap in a planar manner, the effect of cutting off by the pattern P1a and the pattern P1b can be exhibited to the maximum. For example, part of light can be cut off by the pattern P1b, however, part of light passes through the gap between the patterns P1b. Consequently, by shifting the arrangement of the patterns P1b in a planar manner with respect to that of the patterns P1a, the light that cannot be cut off by the pattern P1b can be cut off by the pattern P1a. From this, it can be seen that shifting the arrangement of the patterns P1a in a planar manner with respect to the arrangement of the patterns P1b is effective from the standpoint of the cut off of the light reflected in the lower layer of the pattern P1a or the pattern P1b of the semiconductor substrate 1S etc.

Further, the provision of the pattern P2 and the pattern P3 in the lower layer of the pattern P1a and the pattern P1b is also effective from the standpoint of the reduction in the amount of light output from the background region. That is, irregularities are formed at the surface of the semiconductor substrate 1S by the pattern P2 and the pattern P3. Consequently, the light that has passed through the pattern P1a and the pattern P1b reaches the semiconductor substrate 1S. At this time, if the surface of the semiconductor substrate 1S is flat, the direction of the reflected light converges in a certain direction. If the converged direction is a direction in which light passes through the pattern P1b and the pattern P1a, it is no longer possible to cause the effect of cut off by the pattern P1a and the pattern P1b to exhibit sufficiently. In contrast to this, by forming the pattern P2 and the pattern P3 over the surface of the semiconductor substrate 1S, it is possible to form irregularities over the surface of the semiconductor substrate 1S. If the irregularities are formed over the surface of the semiconductor substrate 1S, light is scattered by the irregularities. That is, light incident to the semiconductor substrate 1S is scattered and light is output in unspecified directions. In this case, the amount of light that is cut off without passing through the pattern P1a and the pattern P1b increases. That is, by forming the pattern P2 and the pattern P3 in the lower layer of the pattern P1a and the pattern P1b, it is possible to make random the direction of the light reflected from the semiconductor substrate 1S. As a result, it is possible to prevent the reflected light from converging in the direction in which light passes through the pattern P1a and the pattern P1b and the effect of cut off by the pattern P1a and the pattern P1b can be improved.

As described above, by arranging the pattern P1a and the pattern P1b in the same layer as that of the wiring layer between the semiconductor substrate 1S and the mark MK1, the cut off effect of the light reflected in the lower layer of the pattern P1a and the pattern P1b can be obtained. Further, by forming the pattern P2 and the pattern P3 over the surface of the semiconductor substrate 1S, it is possible to improve the cut off effect of the light by the pattern P1a and the pattern P1b. That is, by forming the patterns P1a, P1b, P2 and P3 as in the first embodiment, the sufficient cut off effect that makes use of scattering of light can be obtained. It can be seen that the amount of reflected light that enters the camera from the background region can be reduced by the effect of the scattering and cut off of light due to the second mechanism described above.

Next, a third mechanism will be described, which can make large the difference in contrast between the MK1 and the background region by forming the patterns P1a, P1b, P2 and P3. Conventionally, the patterns P1a, P1b, P2, and P3 are not formed in the lower layer of the mark MK1 in the alignment mark formation region. That is, in the alignment mark formation region, the mark MK1 is formed in the same layer as that of the uppermost layer wiring (wiring L3) formed in the integrated circuit formation region, however, the patterns P1a, P1b, P2 and P3 are not formed in the lower layer of the mark MK1. In this case, the following situation is brought about. For example, in the integrated circuit formation region, the gate electrode G of the n-channel type MISFET is formed and over the gate electrode G, the first layer wiring L1 is formed via the interlayer insulating film (the silicon nitride film 7 and the silicon oxide film 8). Then, over the first layer wiring L1, the second layer wiring L2 is formed via the silicon oxide film 9 and over the second layer wiring L2, the third layer wiring L3 is formed via the silicon oxide film 10. In contrast to this, in the conventional alignment mark formation region, no pattern is formed in the same layer as that of the gate electrode G (pattern P2), in the same layer as that of the first layer wiring L1 (pattern P1b), nor in the same layer as that of the second layer wiring L2 (pattern P1a). Consequently, for example, the flatness of the silicon oxide film 8 formed so as to cover the gate electrode G is degraded. That is, in the integrated circuit formation region, the silicon oxide film 8 is formed so as to cover the gate electrode G, however, in the alignment mark formation region, the pattern P2 is not formed in the same layer as that of the gate electrode G, and therefore, the silicon oxide film 8 is formed over the semiconductor substrate 1S. This means that the roughness of a foundation that forms the silicon oxide film differs considerably between the integrated circuit formation region and the alignment mark formation region. As a result, the flatness of the silicon oxide film 8 formed in the alignment mark formation region is degraded. Similarly, in the integrated circuit formation region, the first layer wiring L1 is formed, however, in the alignment mark formation region, the pattern (pattern P1b) corresponding to the first layer wiring L1 is not formed, and therefore, the flatness of the silicon oxide film 9 formed in the alignment mark formation region is also degraded. Further, in the integrated circuit formation region, the second layer wiring L2 is formed, however, in the alignment mark formation region, the pattern (pattern P1a) corresponding to the second layer wiring L2 is not formed, and therefore, the flatness of the silicon oxide film 10 formed in the alignment mark formation region is also degraded. That is, when the foundation pattern is even, the flatness of the film formed over the foundation pattern is excellent, however, if the foundation pattern is not even, the flatness of the film formed on the foundation pattern is degraded. From this, it is impossible to conclude that the flatness in the alignment mark formation region is excellent. In the alignment mark formation region, the mark MK1 is formed in the uppermost layer over the interlayer insulating film, and therefore, if the flatness of the interlayer insulating film formed in the lower layer of the mark MK1 is degraded, the roughness of the interlayer insulating film is reflected in the flatness of the mark MK1 and the flatness of the mark MK is also degraded. If the flatness of the mark MK1 is degraded, the traveling direction of the light reflected from the mark MK1 varies. Consequently, when the light reflected from the mark MK1 is recognized with a camera arranged in a specific direction, the amount of reflected light that travels in the specific direction in which the camera is arranged reduces. As a result, the difference between the reflected light from the mark MK1 that enters the camera and the reflected light from the background region becomes small and the difference in contrast between the mark MK1 and the background region becomes small, resulting in the reduction in the visibility of the alignment mark with the camera. As a result, the positioning precision of the semiconductor chip is degraded.

In contrast to this, in the first embodiment, the patterns P1$a$, P1$b$, P2, and P3 are formed in the lower layer of the mark MK1 formed in the alignment mark formation region. For example, in the alignment mark formation region, the pattern P2 is formed in the same layer as that of the gate electrode G formed in the integrated circuit formation region, and therefore, the pattern of the foundation film by the gate electrode G and the pattern P2 becomes even and it is possible to improve the flatness of the silicon oxide film 8 formed on the gate electrode G and the pattern P2. Similarly, in the alignment mark formation region, the pattern P1$b$ is formed in the same layer as that of the first layer wiring L1 formed in the integrated circuit formation region and further, the pattern P1$a$ is formed in the same layer as that of the second layer wiring L2, and therefore, it is possible to improve the flatness of the silicon oxide film 9 and the silicon oxide film 10. From this, the flatness of the mark MK1 can also be improved because the flatness of the foundation film formed in the lower layer of the mark MK1 is improved in the alignment mark formation region. As a result, the light reflected from the mark MK1 travels all together in the specific direction, and therefore, by arranging the camera in the specific direction, it is possible to suppress the amount of light reflected from the mark MK1 from reducing. Consequently, the difference between the reflected light from the mark MK1 that enters the camera and the reflected light from the background region becomes large and the difference in contrast between the mark MK1 and the background region is improved. Consequently, it is possible to suppress the visibility of the alignment mark with a camera from reducing and improve the positioning precision of a semiconductor chip.

In particular, in the first embodiment, the arrangement of the patterns P1$a$, P1$b$, P2 and P3 also immediately under the mark MK1 functions effectively. For example, from the standpoint of the first mechanism and the second mechanism, it is possible to obtain the effect that the amount of light reflected from the background region can be reduced only by providing the patterns P1$a$, P1$b$, P2, and P3 immediately under the background region. In contrast to this, from the standpoint of the third mechanism that improves the flatness of the mark MK1, the formation of the pattern equivalent to the pattern formed in the integrated circuit formation region immediately under the mark MK1 has a meaning. With such a configuration, it is possible to improve the flatness of the foundation film formed immediately under the mark MK1 and therefore to improve the flatness of the mark MK1. That is, from the standpoint of the third mechanism, by forming the patterns P1$a$, P1$b$, P2 and P3 immediately under the mark MK1 in the alignment mark formation region, it is possible to obtain the remarkable effect that the flatness of the mark MK1 can be improved.

From the above, in the first embodiment, it is possible to make large the difference in contrast of the alignment mark by means of the first mechanism that makes use of the diffraction and interference of light, the second mechanism that makes use of the scattering and cut off of light, and the third mechanism that makes use of the evenness of the foundation pattern.

Consequently, the visibility of the alignment mark is improved and the positioning precision of a semiconductor chip can be improved. That is, in the first embodiment, even if the difference in contrast of the alignment mark varies for each semiconductor chip, it is possible to obtain a difference in contrast that overcomes the variations. From this, it is possible to improve the visibility of the alignment mark and improve the positioning precision of any semiconductor chip even if the semiconductor chip is obtained from a different semiconductor wafer or the semiconductor chip is obtained from a difference chip region of the same semiconductor chip.

Next, the difference between the technical idea in the first embodiment and the technique described in the documents of the prior art described in "BACKGROUND OF THE INVENTION" will be described.

In patent document 1 (Japanese patent laid-open No. 11-330247), a technique is described, which is capable of accurately detecting an alignment mark when forming an alignment mark for laser trimming within a chip. Specifically, over the surface of a semiconductor substrate made of an SOI substrate, there is provided a tapered part oblique with respect to the normal direction at least in the peripheral region of the alignment mark and laser light is bound to be reflected in a direction different from the normal direction at the tapered part. As a result, it is possible to reduce the reflection of laser light in the normal direction of the semiconductor substrate in the peripheral region of the alignment mark, and therefore, it is possible to accurately distinguish the alignment mark from its peripheral region. Consequently, it is concluded that the detection of an alignment mark can be carried out accurately also when forming an alignment mark within a chip. In this case, the tapered part is formed in the same layer as that of the element isolation region formed in the semiconductor substrate. In patent document 1, the element isolation region is formed by LOCOS (Local Oxidation of Silicon) and the pattern similar to LOCOS is formed also in the peripheral region of the alignment mark. Then, it is possible to shift the reflection direction of laser light from the normal direction of the semiconductor substrate by making use of the fact that there are tapered parts on both ends of LOCOS. As a result, according to the technique described in patent document 1, it is possible to improve the detection accuracy of alignment mark by irradiating laser light to the semiconductor substrate and based on the difference in intensity between light reflected from the alignment mark and light reflected from the background region (peripheral region of the alignment mark). This technique is premised on the incidence of laser light and if, for example, general lighting with a xenon lamp, which has a random direction, is used, the effect is reduced. That is, with a xenon lamp, the direction of incident light is random, and therefore, the reflected light is also output in a random direction. In this case, even if the tapered part is provided over the main surface of the semiconductor substrate, incident light in a ransom direction is just converted into reflected light in a random direction, and therefore, the effect of the provision of the tapered part is small. The technique described in patent document 1 is a technique that can be applied to the case where laser light incident to the semiconductor substrate in the normal direction is reflected in the normal direction of the semiconductor substrate.

In contrast to this, the technical idea described in the first embodiment provides the patterns P1$a$, P1$b$, P2 and P3 across a plurality of layers in the lower layer of the mark MK1 and the background region formed in the alignment mark formation region. Consequently, the effect can be obtained by the first mechanism that makes use of diffraction and interference of light. This function is not described nor suggested in the technique described in patent document 1. In particular, in patent document, only the tapered part is provided and the technique is effective only when the semiconductor substrate is irradiated with laser light in the normal direction. On the other hand, in the first embodiment, the effect can be obtained when not only laser light but also a xenon lamp having an incident light of random direction is used. According to the configuration in the first embodiment, even when a xenon lamp is used, it is possible to reduce reflected light from the background region due to the first mechanism because the phenomenon of diffraction and interference of light occurs.

Further, by providing the patterns P1a, P1b in the same layer as that of the wiring layer of the integrated circuit formation region, the second mechanism is realized that makes use of the cut off effect of light besides the diffraction and interference of light described above. The cut off effect of light is not described nor suggested in patent document 1. In particular, by providing the pattern P2 in the same layer as that of the gate electrode G and the pattern P3 in the same layer as that of the element isolation region STI as well as providing the patterns P1a, P1b in the same layer as that of the wiring layer in the integrated circuit formation region, scattering of light over the main surface of the semiconductor substrate 1S is also made use of. That is, there is an advantage that the cut off effect of reflected light by the patterns P1a, P1b can be improved by making use of scattering of light over the main surface of the semiconductor substrate 1S. This point is also not described nor suggested in patent document 1.

In the third embodiment, it is possible to improve flatness of the mark MK1 due to the third mechanism, and also from this standpoint, it is concluded that the visibility of alignment mark can be improved. In contrast to this, in patent document 1, the flatness of alignment mark is not described nor suggested.

From the above, the characteristic of the first embodiment that the visibility of alignment mark can be improved by the first mechanism that makes use of diffraction and interference of light, the second mechanism that makes use of scattering of light and cut off of light, and the third mechanism that makes use of the evenness of the foundation pattern is not described nor suggested in patent document 1 and there is no description that will motivate the thinking of the technical idea of the first embodiment. Therefore, it can be thought that it is difficult for even a person skilled in the art to hit on the technical idea of the first embodiment from the technique described in patent document 1.

Subsequently, the difference in technical idea between patent document 2 (Japanese patent laid-open No. 2000-182914) and the first embodiment will be described. In patent document 2, a diffusion reflection layer made of aluminum is formed in the peripheral region of a cross-shaped mark main body part formed as a solid pattern of an aluminum layer. It describes that as a diffusion reflection layer, for example, a stripe-shaped, grating-shaped, or dot-shaped fine pattern formed by an aluminum layer can be used. In this case, the diffusion reflection layer formed in the peripheral region of the cross-shaped mark main body part is formed in the same layer as that of the mark main body part.

The technique described in patent document 2, forms the diffusion reflection layer in the peripheral region in the same layer as that of the mark main body part and reduces the reflected light from the diffusion reflection layer due to scattering and interference of light by the diffusion reflection layer.

In contrast to this, in the first embodiment, the different point is that the patterns P1a, P1b, P2 and P3 are provided in the lower layer of the mark MK1 and the background region, not in the same layer as that of the mark MK1 and the background region. As described above, the first embodiment is characterized by providing the patterns P1a, P1b, P2 and P3 in the lower layer of the mark MK1 and the background region and the first embodiment brings about the remarkable effect that cannot be obtained from the configuration in patent document 2 in which the diffusion reflection layer is formed in the same layer as that of the mark main body part.

This point will be described. Firstly, in the semiconductor chip, which is the LCD driver, the alignment mark is formed for positioning. The alignment mark is formed by the mark and the background region surrounding the mark. According to the general specifications of alignment mark, nothing is formed in the background region in the same layer as that of the mark. This is to improve the visibility of the mark itself and prevent the possibility of degradation of visibility if an excessive pattern is formed in the background region in the same layer as that of the mark. As a result, the technique as described in patent document 2, in which the diffusion reflection layer is formed in the same layer as that of the mark main body part, does not satisfy the specifications, and therefore, it cannot be a practical configuration from the standpoint of satisfying the specifications. On the other hand, in the first embodiment, nothing is formed in the same layer as that of the mark MK1 and the patterns P1a, P1b, P2 and P3 are formed in the lower layer of the mark MK1 and the background region. In this case, nothing is formed in the background region in the same layer as that of the mark MK1, and therefore, the configuration in the first embodiment satisfies the specifications unlike patent document 2.

Secondly, in patent document 2, the diffusion reflection layer is formed in the same layer as that of the mark main body part. The mark main body part is formed by the uppermost layer wiring and the diffusion reflection layer formed in the same layer as that of the mark main body part is also formed by the uppermost layer wiring. In general, however, the film thickness of the uppermost layer wiring is much greater than that of the wiring in other layers and it is difficult to fine process the thick uppermost layer wiring. That is, in patent document 2, the diffusion reflection layer composed of the grating-shaped or dot-shaped fine pattern is formed in the same layer as that of the mark main body part, however, the diffusion reflection layer is formed by processing the uppermost layer wiring, and therefore, it is difficult to fine process the uppermost layer wiring so as to sufficiently realize scattering and interference of light. In contrast to this, in the first embodiment, instead of the uppermost layer wiring, a wiring thin in film thickness formed in the lower layer than the uppermost layer wiring is used and processed, and therefore, it is possible to easily form a fine pattern having intervals of the size of visible light.

Thirdly, in patent document 2, the diffusion reflection layer is formed in the uppermost layer of the wiring layer, and therefore, the residual ratio of the metal film in the uppermost layer increases. That is, if the diffusion reflection layer is not formed, only the mark main body part is formed in the uppermost layer of the wiring in the alignment mark formation region, as a result. In contrast to this, in patent document 2, the diffusion reflection layer made of metal film is formed in the same layer as that of the mark main body part, and therefore, the coating rate of the metal film increases. The mark main body part and the diffusion reflection layer are formed by the normal patterning and in the normal patterning, etching of the metal film is carried out. In the etching, detection of an end-point is carried out with plasma light emission. That is, by etching a formed metal film, the mark main body part and the diffusion reflection layer are processed. At this time, when the diffusion reflection layer is formed, the more metal film is caused to remain corresponding to the amount of the formation of the diffusion reflection layer. In other words, the unwanted metal film is removed by etching, however, the diffusion reflection layer is formed, and accordingly, the region of etching is reduced.

During the period of etching, the product due to the etching is abundant in quantity and the intensity of light emission from the product is high. In contrast to this, in the vicinity of the endpoint of the etching, the product due to the etching decreases in quantity and therefore the intensity of light emission from the product becomes small. By monitoring the difference in light emission intensity from the product, the endpoint is detected. That is, it is possible to detect the endpoint of the etching by making use of the fact that the difference in light emission intensity from the product due to the etching becomes large.

However, when the diffusion reflection layer is formed, the area of the region of etching decreases, and therefore, the intensity of light emission from the product becomes small even during the period of etching. This means that the difference in light emission intensity by the product becomes small between during the period of etching and near the endpoint of the etching. If the difference in light emission intensity of the product becomes small, it becomes difficult to detect the endpoint of the etching. That is, if the residual ratio of metal film in the uppermost layer increases due to the formation of the diffusion reflection layer, the possibility is increased that the detection of the endpoint of the etching for processing the mark main body part and the diffusion reflection layer cannot be carried out accurately. If the accurate detection of the endpoint of the etching becomes difficult to carry out, there arise problems of poor processing due to the incompleteness of the etching, and the reduction in processed dimensions due to over-etching, etc. Consequently, from the standpoint of the execution of the accurate processing of the mark main body part formed in the uppermost layer, it can be seen that it is desirable not to form the diffusion reflection layer of metal film in the same layer as that of the mark main body part. As to this point, in the first embodiment, no pattern is formed in the background region in the same layer as that of the mark, and therefore, the above-mentioned problems can be avoided. As a result, there is an advantage that an attempt can be made to improve the processing precision of the mark that will result in the improvement of the visibility of alignment mark.

Fourthly, the characteristic of the first embodiment that the visibility of alignment mark can be improved by the first mechanism that makes use of diffraction and interference of light, the second mechanism that makes use of scattering of light and cut off of light, and the third mechanism that makes use of the evenness of the foundation pattern is not described nor suggested in patent document 2 and there is no description that will motivate the thinking of the technical idea of the first embodiment. From the above, it can be thought that it is difficult for even a person skilled in the art to hit on the technical idea of the first embodiment from the technique described in patent document 2.

The semiconductor device in the first embodiment is configured as described above, and the method of manufacturing the same will be described below with reference to the drawings. The configuration of the semiconductor device in the first embodiment is shown as those in FIG. 6 to FIG. 8, however, for the sake of simple explanation, a configuration in FIG. 9 is also formed, which is a combination of those in FIG. 7 and FIG. 8. In the method of manufacturing the semiconductor device in the first embodiment, a section view corresponding to FIG. 9 is used for explanation in order to make easier-to-see the positional relationship between the patterns P1*a*, P1*b*, P2 and P3 formed in the alignment mark formation region.

Figure 11:
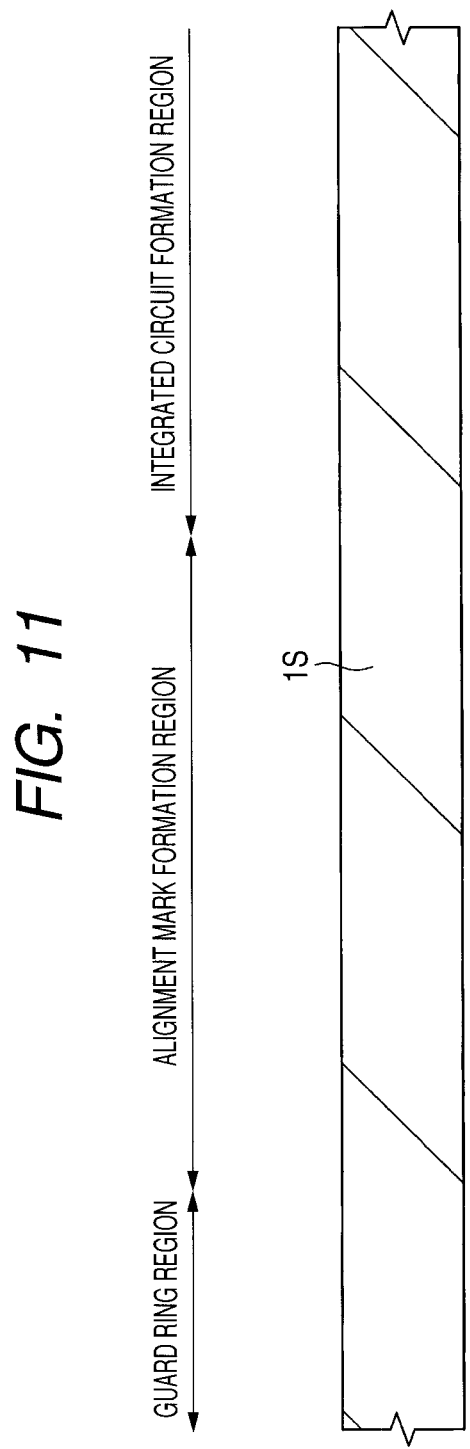
FIG. 11 is a section view showing a manufacturing process of a semiconductor device in the first embodiment.
Figure 12:
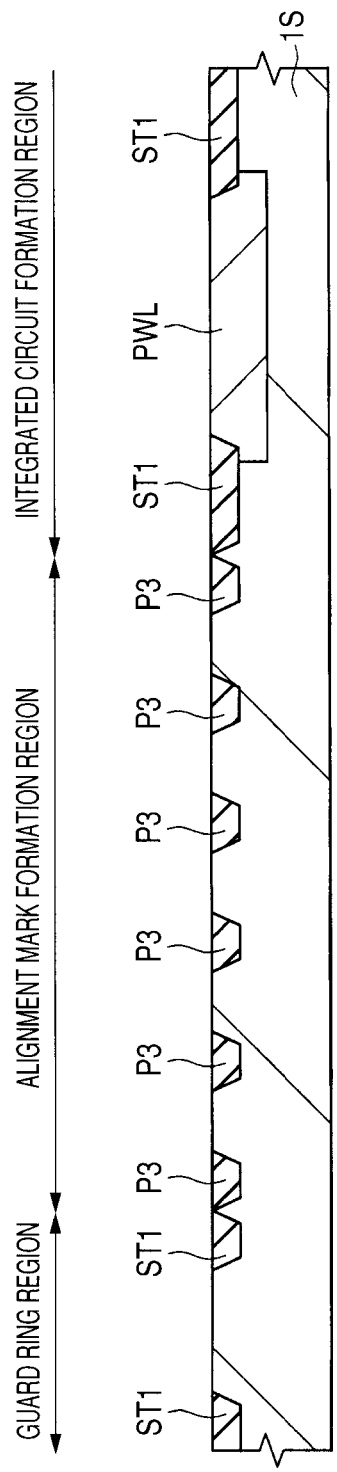
FIG. 12 is a section view showing a manufacturing process of the semiconductor device following FIG. 11.

First, as shown in FIG. 11, the semiconductor substrate 1S made of silicon single crystal into which p-type impurities such as boron (B) have been introduced is prepared. In this case, the semiconductor substrate 1S is in the state of a semiconductor wafer in the shape of substantially a circular disc. Then, as shown in FIG. 12, the element isolation region STI that isolates the elements is formed in the integrated circuit formation region of the semiconductor substrate 1S is formed. The element isolation region STI is formed to prevent the elements from interfering with each other. The element isolation region STI can be formed using, for example, the STI (Shallow trench isolation) method. For example, by the STI method, the element isolation region STI is formed as follows. That is, an element isolation groove is formed on the semiconductor substrate 1S by using the photolithography technique and the etching technique. Then, a silicon oxide film is formed over the semiconductor substrate 1S so as to be embedded in the element isolation groove. After that, by the CMP (chemical mechanical polishing) method, the unwanted silicon oxide film formed over the semiconductor substrate 1S is removed. Consequently, it is possible to form the element isolation region STI in which the silicon oxide film is embedded only in the element isolation groove. In the first embodiment, in the process for forming the element isolation region STI in the integrated circuit formation region, the element isolation region STI is formed also in the guard ring region and the pattern P3 is formed also in the alignment mark formation region. The pattern P3 formed in the alignment mark formation region also has a structure in which the silicon oxide film is embedded in the groove similar to the element isolation region STI formed in the integrated circuit formation region. In the first embodiment, one of the characteristics is that the pattern P3 is formed in the alignment mark formation region and it is possible to simplify the process by forming the pattern P3 in the same process as that of the element isolation region STI.

Next, the p-type well PWL is formed by introducing impurities into the active region of the integrated circuit formation region isolated by the element isolation region STI. The p-type well PWL is formed by introducing p-type impurities such as boron into the semiconductor substrate 1S by the ion implantation method.

Subsequently, a semiconductor region (not shown) for forming a channel is formed in the surface region of the p-type well PWL. The channel formation semiconductor region is formed in order to adjust a threshold voltage that forms a channel.

Figure 13:
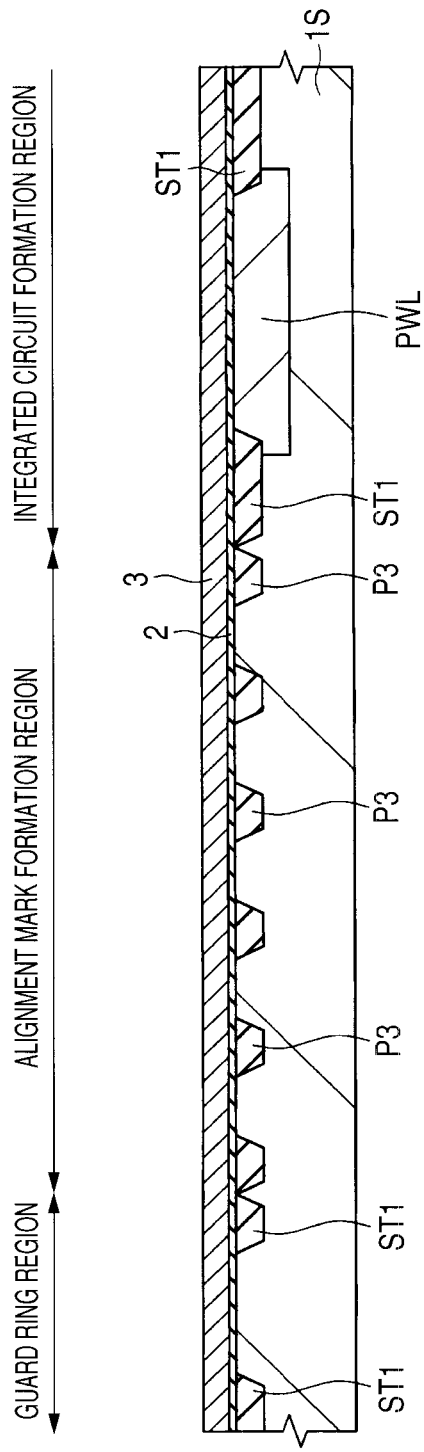
FIG. 13 is a section view showing a manufacturing process of the semiconductor device following FIG. 12.

Next, as shown in FIG. 13, the gate insulating film 2 is formed over the semiconductor substrate 1S. The gate insulating film 2 is formed by, for example, a silicon oxide film and can be formed by using, for example, the thermal oxidation method. However, the gate insulating film 2 is not limited to the silicon oxide film but there can be various modifications and, for example, the gate insulating film 2 may be formed by a silicon oxynitride film (SiON). That is, the structure may be one in which nitrogen is segregated in the boundary face between the gate insulating film 2 and the semiconductor substrate 1S. The silicon oxynitride film is more effective than the silicon oxide film in suppressing the occurrence of boundary face level in the film and in reducing the electron trap. Consequently, it is possible to improve the hot carrier resistant property and the insulating property of the gate insulating film 2. The silicon oxynitride film is more difficult for impurities to penetrate, through compared to the silicon oxide film. Consequently, by using the silicon oxynitride film as the gate insulating film 2, it is possible to suppress the variations in the threshold voltage resulting from the diffusion of impurities in the gate electrode toward the side of the semiconductor substrate. The silicon oxynitride film can be formed by subjecting the semiconductor substrate 1S to a heat treatment in an atmosphere of NO, $NO_2$, or $NH_3$, which includes nitrogen. It is also possible to obtain the same effect by, after forming the gate insulating film 2 made of silicon oxide film over the surface of the semiconductor substrate 1S, subjecting the semiconductor substrate 1S to a heat treatment in an atmosphere including nitrogen and segregating nitrogen in the boundary face between the gate insulating film 2 and the semiconductor substrate 1S.

The gate insulating film 2 may also be formed by, for example, a high dielectric constant film having a higher dielectric constant than that of the silicon oxide film. Conventionally, the silicon oxide film is used as the gate insulating film 2 from the standpoint of the fact that the insulating property is excellent and the electric/physical stability in the boundary surface between silicon and silicon oxide is excellent. However, as miniaturization of elements advances, the film thickness of the gate insulating film 2 is demanded to be extremely thin. If such a thin silicon oxide film is used as the gate insulating film 2, the electrons that flow through the MISFET channel penetrate through the barrier wall formed by the silicon oxide film to the gate electrode, that is, a so-called tunnel current occurs.

Therefore, recently, a high dielectric film comes to be used, which can increase a physical film thickness even with the same capacitance by use of a material having a higher dielectric constant than that of a silicon oxide film. The high dielectric constant film makes it possible to increase the physical film thickness while maintaining its capacitance unchanged, thereby reducing leak current.

For example, as a high dielectric film, a hafnium oxide film ($HfO_2$ film) is used, which is one of hafnium oxides. However, instead of the hafnium oxide film, other hafnium-based insulating films such as hafnium aluminate film, HfON film (hafnium oxynitride film), HfSiO film (hafnium silicate film), HfSiON film (hafnium silicon oxynitride film), and HfAlO film, can be used. Further, hafnium-based insulating films that have introduced oxides therein, such as tantalum oxide, niobium oxide, titanium oxide, zirconium oxide, lanthanum oxide, and yttrium oxide, can also be used. Since the hafnium-based insulating film has a higher dielectric constant than that of the silicon oxide film and the silicon oxynitride film, like the hafnium oxide film, the same effect when the hafnium oxide film is used can be obtained.

Subsequently, the polysilicon film 3 is formed over the gate insulating film 2. The polysilicon film 3 can be formed by using, for example, the CVD method. Then, n-type impurities such as phosphorus and arsenic are introduced into the polysilicon film 3 formed in the n-channel type MISFET formation region by using the photolithography technique and the ion implantation method.

Figure 14:
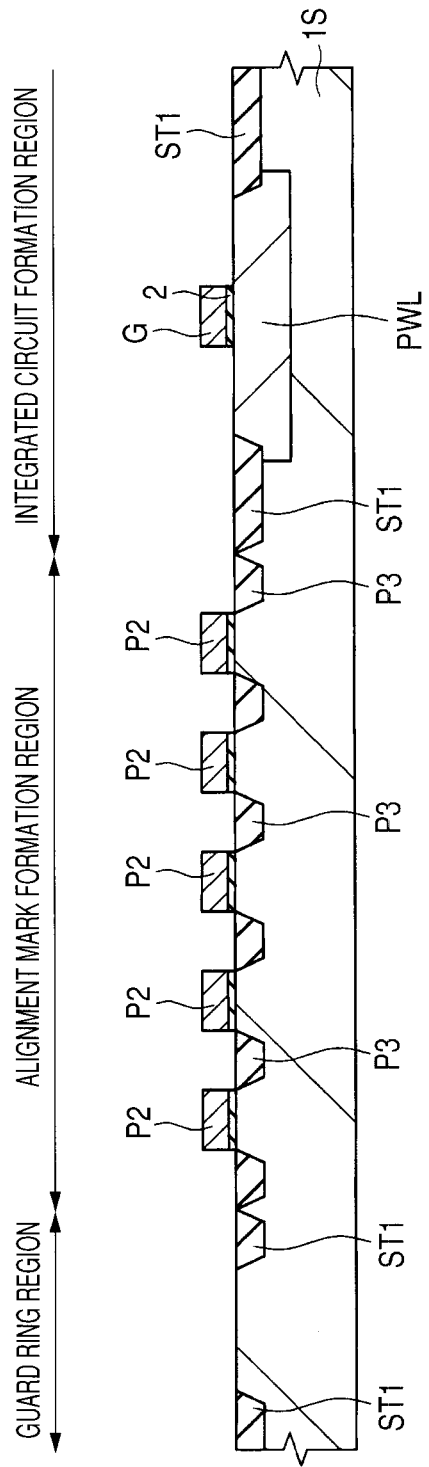
FIG. 14 is a section view showing a manufacturing process of the semiconductor device following FIG. 13.

Next, as shown in FIG. 14, the gate electrode G is formed in the integrated circuit formation region by processing the polysilicon film 3 by etching using a patterned resist film as a mask. With this patterning, the pattern P2 formed in the same layer as that of the gate electrode G is formed in the alignment mark formation region. One of the characteristics of the first embodiment is that the pattern P2 is formed in the alignment mark formation region and the process can be simplified by forming the pattern P2 in the same process as that of the gate electrode G.

Figure 15:
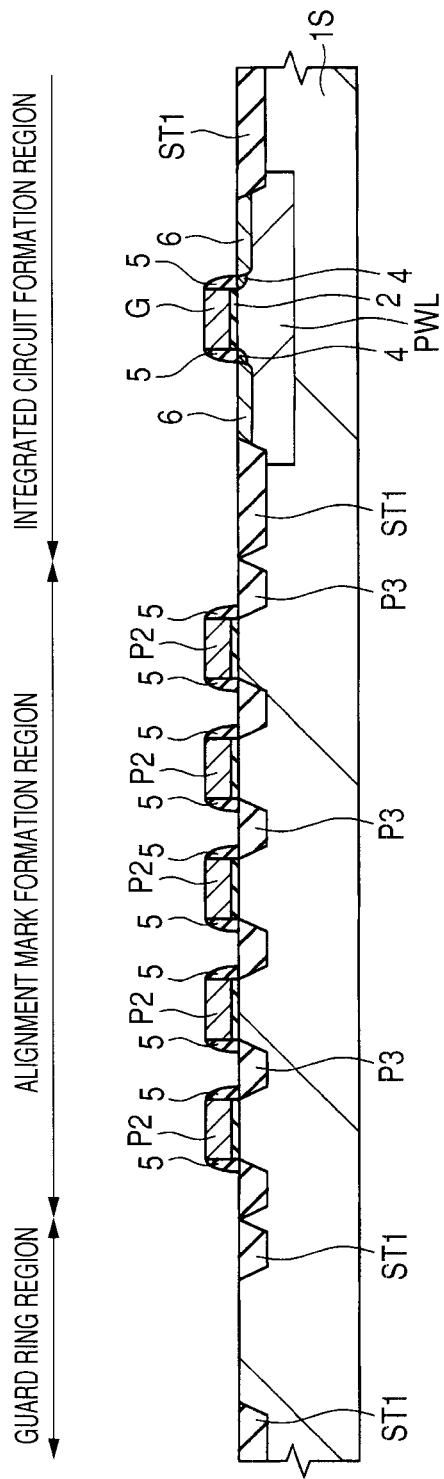
FIG. 15 is a section view showing a manufacturing process of the semiconductor device following FIG. 14.

Here, in the gate electrode G in the integrated circuit formation region, n-type impurities have been introduced into the polysilicon film 3. Consequently, the work function value of the gate electrode G can be set to a value in the vicinity of the conduction band of silicon (4.15 eV), and therefore, it is possible to reduce the threshold voltage of the n-channel type MISFET.

subsequently, as shown in FIG. 15, the low concentration n-type impurity diffusion region 4, which is shallow and consistent with the gate electrode G of the n-channel type MISFET, is formed by using the photolithography technique and the ion implantation method. The shallow low concentration n-type impurity diffusion region 4 is a semiconductor region.

Next, a silicon oxide film is formed over the semiconductor substrate 1S. The silicon oxide film can be formed by, for example, using the CVD method. Then, the sidewall 5 is formed on the sidewall of the gate electrode G by anisotropic etching of the silicon oxide film. The sidewall 5 is formed from a single layer film of the silicon oxide film, however, this is not limited and, for example, a sidewall made up of a laminated film of silicon nitride film and silicon oxide film may be formed.

Subsequently, the high concentration n-type impurity diffusion region 6, which is deep and consistent with the sidewall 5, is formed in the n-channel type MISFET formation region using the photolithography technique and the ion implantation method. The deep high concentration n-type impurity diffusion region 6 is a semiconductor region. The deep high concentration n-type impurity diffusion region 6 and the shallow low concentration n-type impurity diffusion region 4 together form the source region. Similarly, the deep high concentration n-type impurity diffusion region 6 and the shallow low concentration n-type impurity diffusion region 4 together form the drain region. By forming the source region and the drain region by the shallow n-type impurity diffusion region 4 and the deep n-type impurity diffusion region 6 in this manner, it is possible to let the source region and the drain region have the LDD (Lightly Doped Drain) structure.

After forming the deep high concentration n-type impurity diffusion region 6 as described above, a heat treatment at about 1,000° C. is carried out. Consequently, the introduced impurities are activated.

After that, although not shown schematically, for example, a cobalt film is formed over the semiconductor substrate. At this time, the cobalt film is formed so as to directly touch the gate electrode G. Similarly, the cobalt film directly touches also the deep high concentration n-type impurity diffusion region 6.

The cobalt film can be formed using, for example, the sputtering method. After forming the cobalt film and subjecting it to a heat treatment, the polysilicon film 3 constituting the gate electrode G and the cobalt film are caused to react with each other to form a cobalt silicide film (not shown). Consequently, the gate electrode G has a laminated structure of the polysilicon film 3 and the cobalt silicide film (not shown). The cobalt silicide film (not shown) is formed in order to reduce the resistance of the gate electrode G. Similarly, by the above-mentioned heat treatment, silicon and the cobalt film react with each other also over the surface of the deep high concentration n-type impurity diffusion region 6 and the cobalt silicide film (not shown) is formed. As a result, it is possible to reduce the resistance also in the deep high concentration n-type impurity diffusion region 6.

Then, the unreacted cobalt film is removed from the semiconductor substrate 1S. In the first embodiment, the cobalt silicide film (not shown) is formed, however, instead of the cobalt silicide film (not shown), a nickel silicide film or titanium silicide film may be formed.

Figure 16:
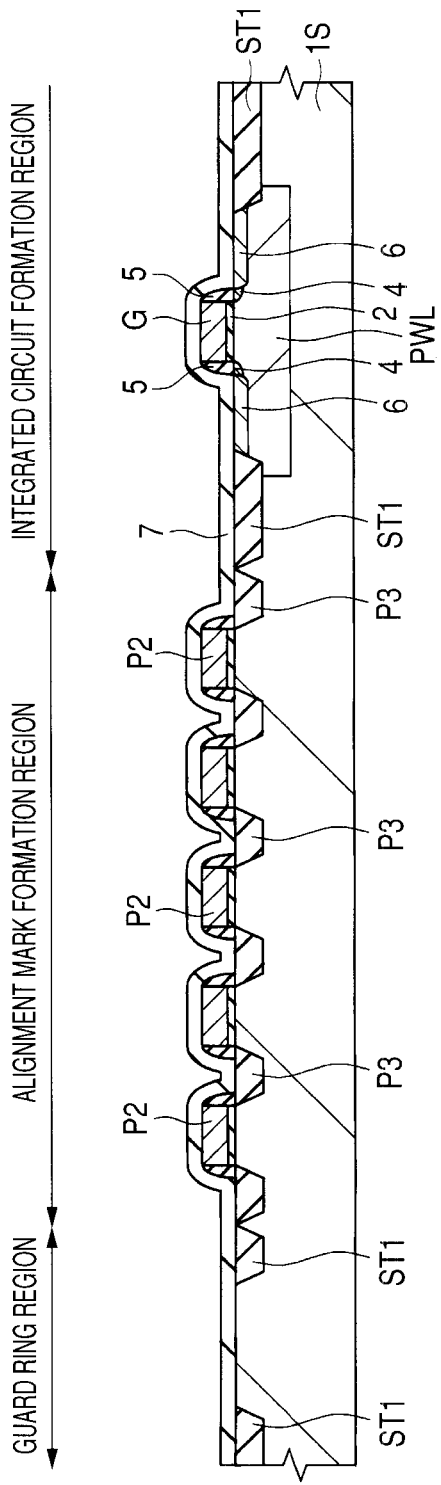
FIG. 16 is a section view showing a manufacturing process of the semiconductor device following FIG. 15.
Figure 17:
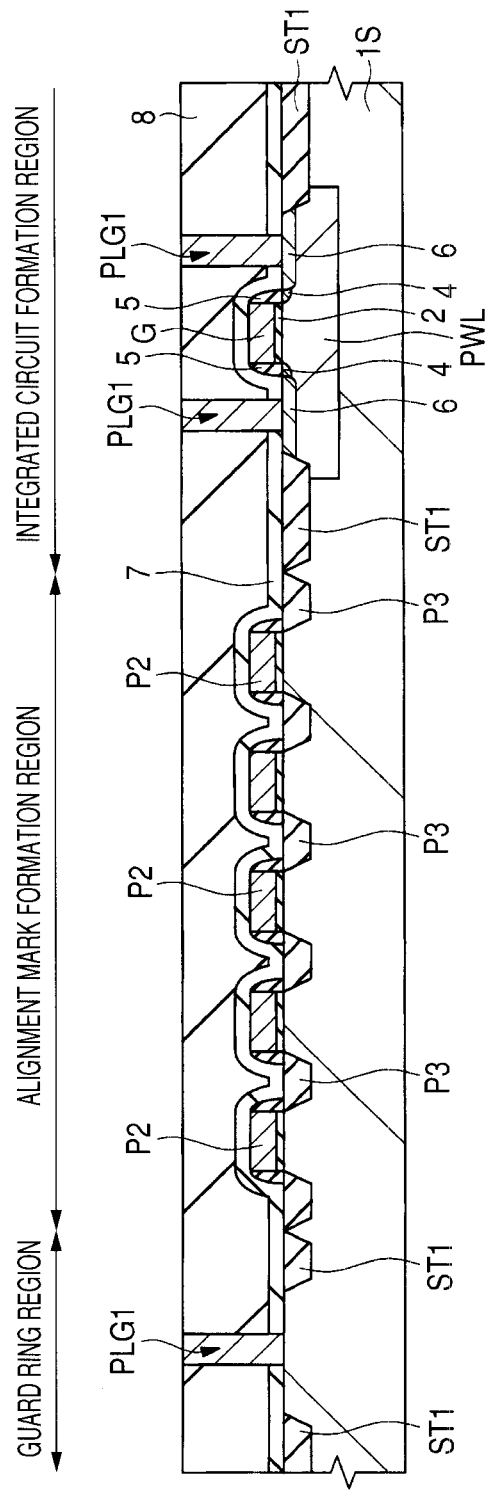
FIG. 17 is a section view showing a manufacturing process of the semiconductor device following FIG. 16.

Next, as shown in FIG. 16, over the main surface of the semiconductor substrate 1S, the silicon nitride film 7, which serves as an interlayer insulating film, is formed. The silicon nitride film 7 can be formed by, for example, the CVD method, and is a film formed to form a contact hole to be formed in the later process by self-align (SAC). Then, as shown in FIG. 17, the silicon oxide film 8, which serves as an interlayer insulating film, is formed over the silicon nitride film. 7. The silicon oxide film 8 can be formed using the CVD method with, for example, TEOS (tetra ethyl ortho silicate) as a raw material. Then, the surface of the silicon oxide film 8 is flattened by using, for example, the CMP (Chemical Mechanical Polishing) method. At this time, in the lower layer of the silicon oxide film 8, which is an interlayer insulating film, the pattern P2 is also formed besides the gate electrode G. Consequently, the foundation pattern (gate electrode G and pattern P2) of the silicon oxide film 8 is even from the integrated circuit formation region to the alignment mark formation region, and therefore, the flatness of the silicon oxide film 8 is improved in the alignment mark formation region.

Subsequently, a contact hole is formed in the silicon oxide film 8 using the photolithography technique and the etching technique. Then, a titanium/titanium nitride film is formed over the silicon oxide film including the bottom and inner wall of the contact hole. The titanium/titanium nitride film is made up of a laminated film of titanium film and titanium nitride film and can be formed by using, for example, the sputtering method. The titanium/titanium nitride film has a so-called barrier property that prevents, for example, tungsten, which is a material of a film to be embedded in a later process, from diffusing into silicon. Then, a tungsten film is formed over the entire main surface of the semiconductor substrate 1S so as to be embedded in the contact hole. The tungsten film can be formed by using, for example, the CVD method. Then, the plug PLG1 can be formed by removing the unwanted titanium/titanium nitride film and the tungsten film formed over the silicon oxide film 8 by, for example, the CMP method. The plug PLG1 is formed in, for example, the integrated circuit formation region and the guard ring region.

Figure 18:
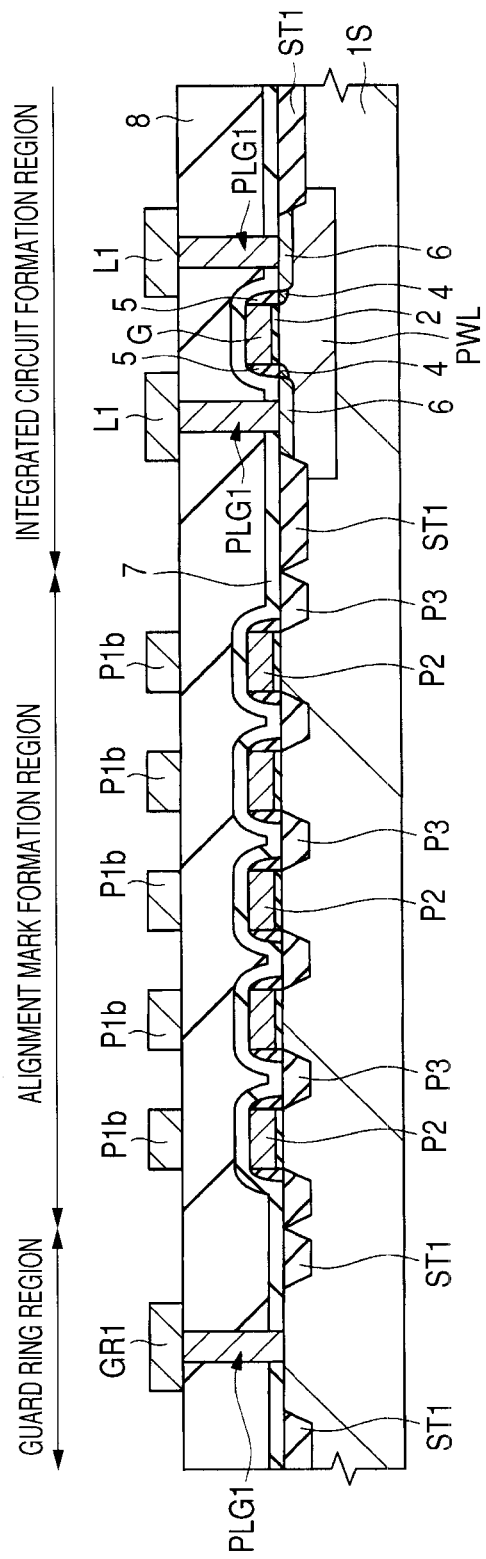
FIG. 18 is a section view showing a manufacturing process of the semiconductor device following FIG. 17.

Next, as shown in FIG. 18, a titanium/titanium nitride film, an aluminum film containing copper and a titanium/titanium nitride film are formed sequentially over the silicon oxide film 8 and the plug PLG1. These films can be formed by using, for example, the sputtering method. Subsequently, these films are patterned by using the photolithography technique and the etching technique and the first layer wiring L1 is formed. In this process, the wiring GR1 is formed in the guard ring region and the pattern P1b is formed in the alignment mark formation region. One of the characteristics of the first embodiment is that the pattern P1b is formed in the alignment mark formation region and the process can be simplified by forming the pattern P1b in the same process as that of the first layer wiring L1. The pattern P1b is formed with the same pattern as that of the pattern P2 formed in the lower layer and the pattern P1b is formed so as to overlap the pattern P2 in a planar manner.

Figure 19:
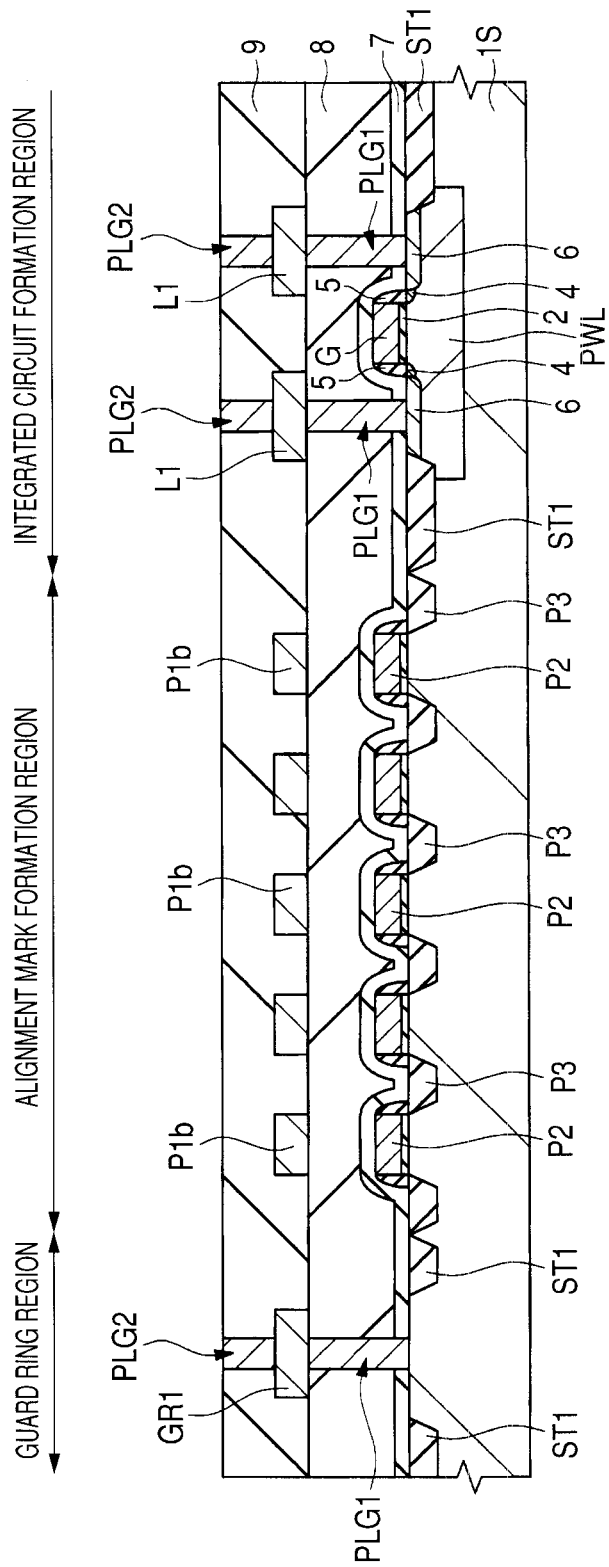
FIG. 19 is a section view showing a manufacturing process of the semiconductor device following FIG. 18.

Subsequently, as shown in FIG. 19, the silicon oxide film 9 is formed over the silicon oxide film 8 as well as over the first layer wiring L1, the pattern P1b, and the wiring GR1. The silicon oxide film 9 can be formed by using the CVD method with, for example, TEOS (tetra ethyl ortho silicate) as raw material. Then, the surface of the silicon oxide film 9 is flattened by using, for example, the CMP (Chemical Mechanical Polishing) method. At this time, in the lower layer of the silicon oxide film 9, which is an interlayer insulating film, the pattern P1b is also formed besides the first layer wiring L1. Consequently, the foundation pattern (the first layer wiring L1 and the pattern P1b) of the silicon oxide film 9 is even from the integrated circuit formation region to the alignment mark formation region, and therefore, the flatness of the silicon oxide film 9 is improved in the alignment mark formation region.

Subsequently, a contact hole is formed in the silicon oxide film 9 using the photolithography technique and the etching technique. Then, a titanium/titanium nitride film is formed over the silicon oxide film including the bottom and inner wall of the contact hole. The titanium/titanium nitride film is made up of a laminated film of titanium film and titanium nitride film and can be form by using, for example, the sputtering method. The titanium/titanium nitride film has a so-called barrier property that prevents, for example, tungsten, which is a material of a film to be embedded in a later process, from diffusing into silicon. Then, a tungsten film is formed over the entire main surface of the silicon oxide film 9 so as to be embedded in the contact hole. The tungsten film can be formed by using, for example, the CVD method. Then, the plug PLG2 can be formed by removing the unwanted titanium/titanium nitride film and the tungsten film formed on the silicon oxide film 9 by, for example, the CMP method. The plug PLG2 is formed in, for example, the integrated circuit formation region and the guard ring region.

Figure 20:
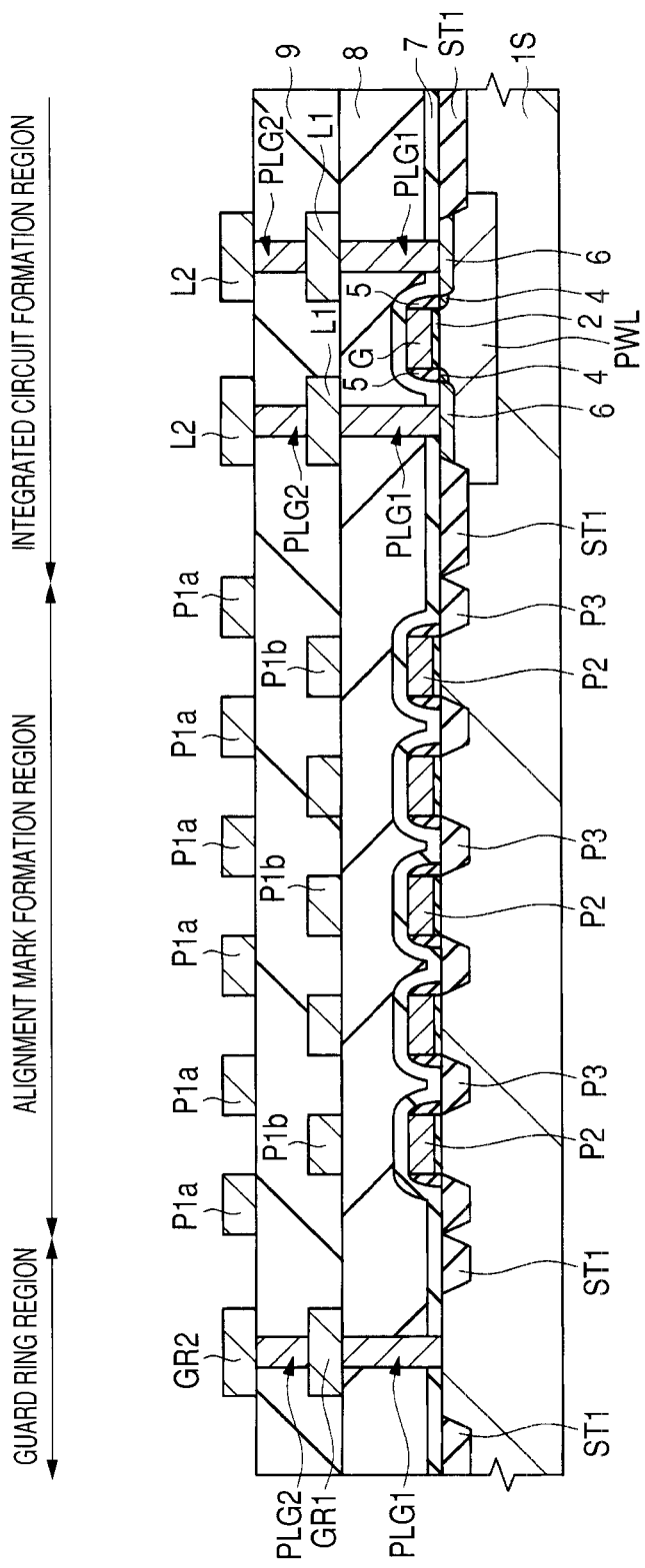
FIG. 20 is a section view showing a manufacturing process of the semiconductor device following FIG. 19.

Next, as shown in FIG. 20, a titanium/titanium nitride film, an aluminum film containing copper and a titanium/titanium nitride film are formed sequentially over the silicon oxide film 9 and the plug PLG2. These films can be formed by using, for example, the sputtering method. Subsequently, these films are patterned by using the photolithography technique and the etching technique and the second layer wiring L2 is formed. In this process, the wiring GR2 is formed in the guard ring region and the pattern P1a is formed in the alignment mark formation region. One of the characteristics of the first embodiment is that the pattern P1a is formed in the alignment mark formation region and the process can be simplified by forming the pattern P1a in the same process as that of the second layer wiring L2. The pattern P1a is formed with a pattern shifted from that of the pattern P2 formed in the lower layer and the pattern P1a is formed so as not to overlap the pattern P1b in a planar manner.

Figure 21:
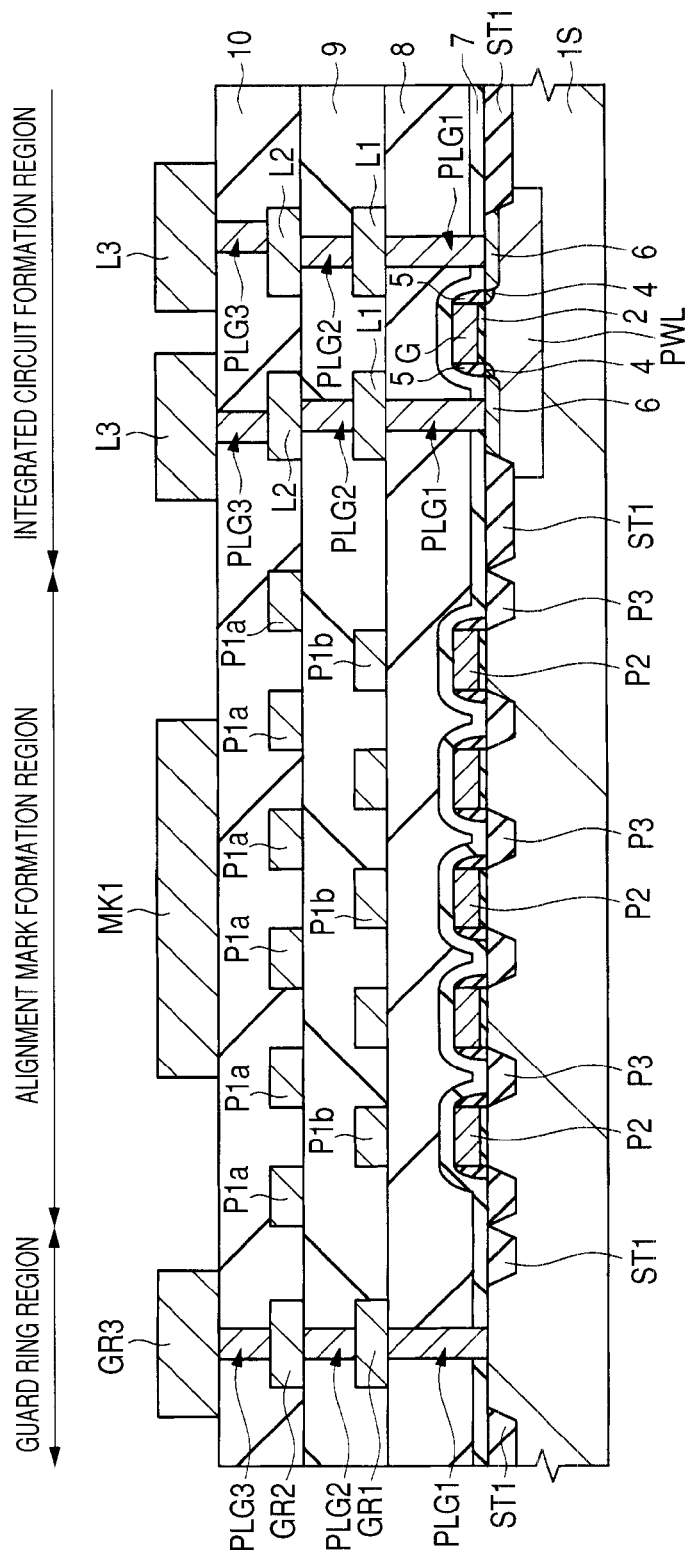
FIG. 21 is a section view showing a manufacturing process of the semiconductor device following FIG. 20.

Subsequently, as shown in FIG. 21, the silicon oxide film 10 is formed over the silicon oxide film 9 as well as over the second layer wiring L2, the pattern P1a, and the wiring GR2. The silicon oxide film 10 can be formed by using the CVD method with, for example, TEOS (tetra ethyl ortho silicate) as a raw material. Then, the surface of the silicon oxide film 10 is flattened by using, for example, the CMP (Chemical Mechanical Polishing) method. At this time, in the lower layer of the silicon oxide film 10, which is an interlayer insulating film, the pattern P1a is also formed besides the second layer wiring L2. Consequently, the foundation pattern (the second layer wiring L2 and the pattern P1a) of the silicon oxide film 10 is even from the integrated circuit formation region to the alignment mark formation region, and therefore, the flatness of the silicon oxide film 10 is improved in the alignment mark formation region.

Subsequently, a contact hole is formed in the silicon oxide film 10 using the photolithography technique and the etching technique. Then, a titanium/titanium nitride film is formed over the silicon oxide film including the bottom and inner wall of the contact hole. The titanium/titanium nitride film is made up of a laminated film of titanium film and titanium nitride film and can be formed by using, for example, the sputtering method. The titanium/titanium nitride film has a so-called barrier property that prevents, for example, tungsten, which is a material of a film to be embedded in a later process, from diffusing into silicon. Then, a tungsten film is formed over the entire surface of the silicon oxide film 10 so as to be embedded in the contact hole. The tungsten film can be formed by using, for example, the CVD method. Then, the plug PLG3 can be formed by removing the unwanted titanium/titanium nitride film and the tungsten film formed over the silicon oxide film 10 by, for example, the CMP method. The plug PLG3 is formed in, for example, the integrated circuit formation region and the guard ring region.

Next, a titanium/titanium nitride film, an aluminum film containing copper, and a titanium/titanium nitride film are formed sequentially over the silicon oxide film 10 and the plug PLG3. These films can be formed by using, for example, the sputtering method. Subsequently, these films are patterned by using the photolithography technique and the etching technique and the third layer wiring L3 is formed. In this process, the wiring GR3 is formed in the guard ring region and the mark MK1 is formed in the alignment mark formation region. In the alignment mark formation region, the patterns P1a, P1b, P2, and P3 are arranged in the lower layer of the mark MK1 and the background region surrounding the mark MK1. In the manner described above, it is possible to form the MISFET and the multilayer wiring in the integrated circuit formation region of the semiconductor substrate 1S and to form the patterns P1a, P1b, P2 and P3 and the mark MK1 in the alignment mark formation region. Further, it is possible to form a guard ring structure in the guard ring region.

Figure 22:
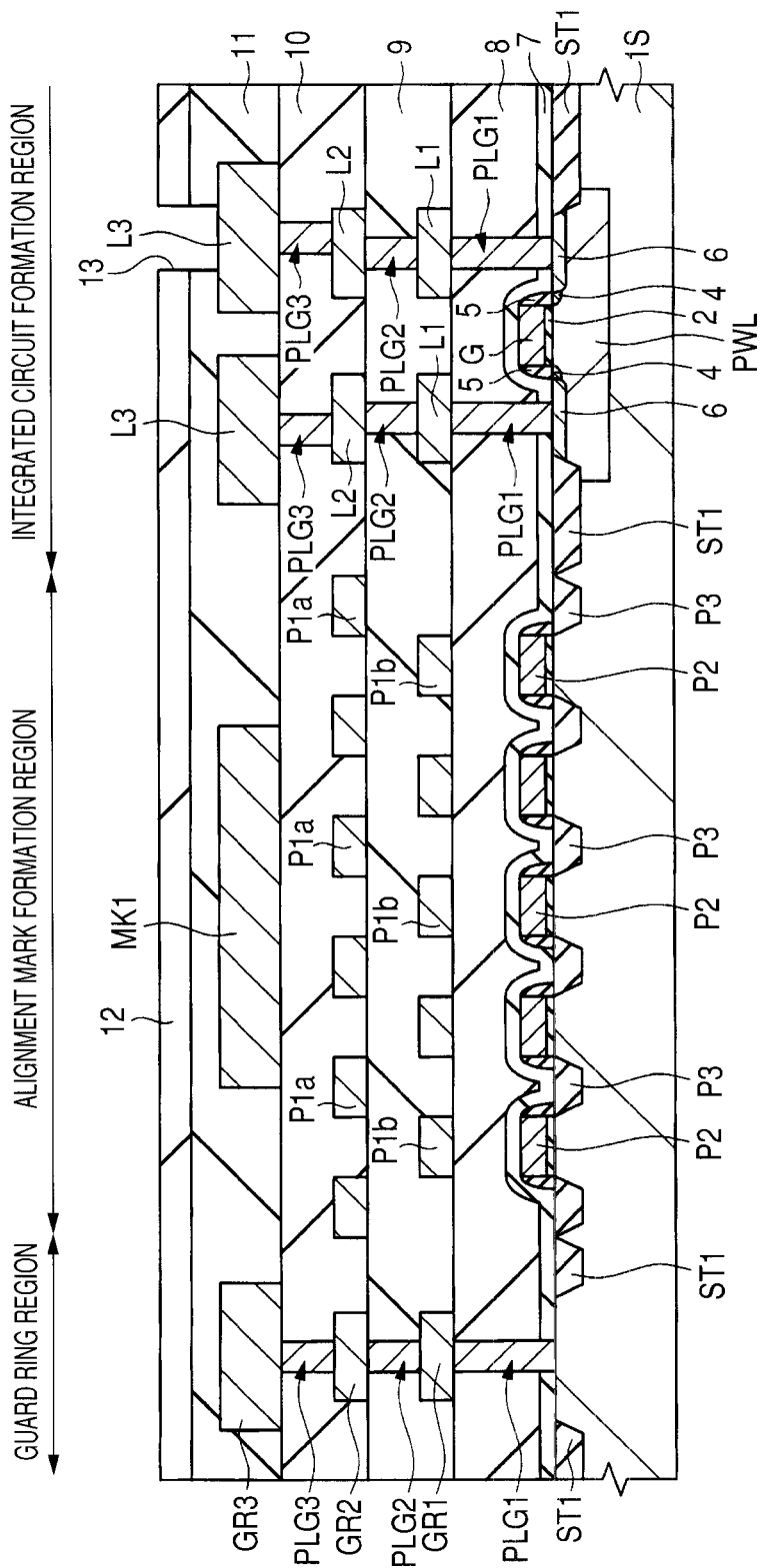
FIG. 22 is a section view showing a manufacturing process of the semiconductor device following FIG. 21.

Next, the process for forming a bump electrode in the integrated circuit formation region will be described. First, as shown in FIG. 22, the silicon oxide film 11 is formed over the silicon oxide film 10 as well as over the third layer wiring L3, the mark MK 1 and the wiring GR3, and over the silicon oxide film 11 the silicon nitride film 12 is formed. The silicon oxide film 11 and the silicon nitride film 12 can be formed by, for example, the plasma CVD method. In this manner, it is possible to form a surface protection film made up of the silicon oxide film 11 and the silicon nitride film 12 over the uppermost layer wiring layer (the third layer wiring L3).

Subsequently, the opening 13 is formed in the surface protection film using the photolithography technique and the etching technique. The opening 13 is formed over the third layer wiring L3 (pad), exposing the surface of the third layer wiring L3. The opening 13 is formed so that its size is smaller than that of the third layer wiring L3 (pad).

Figure 23:
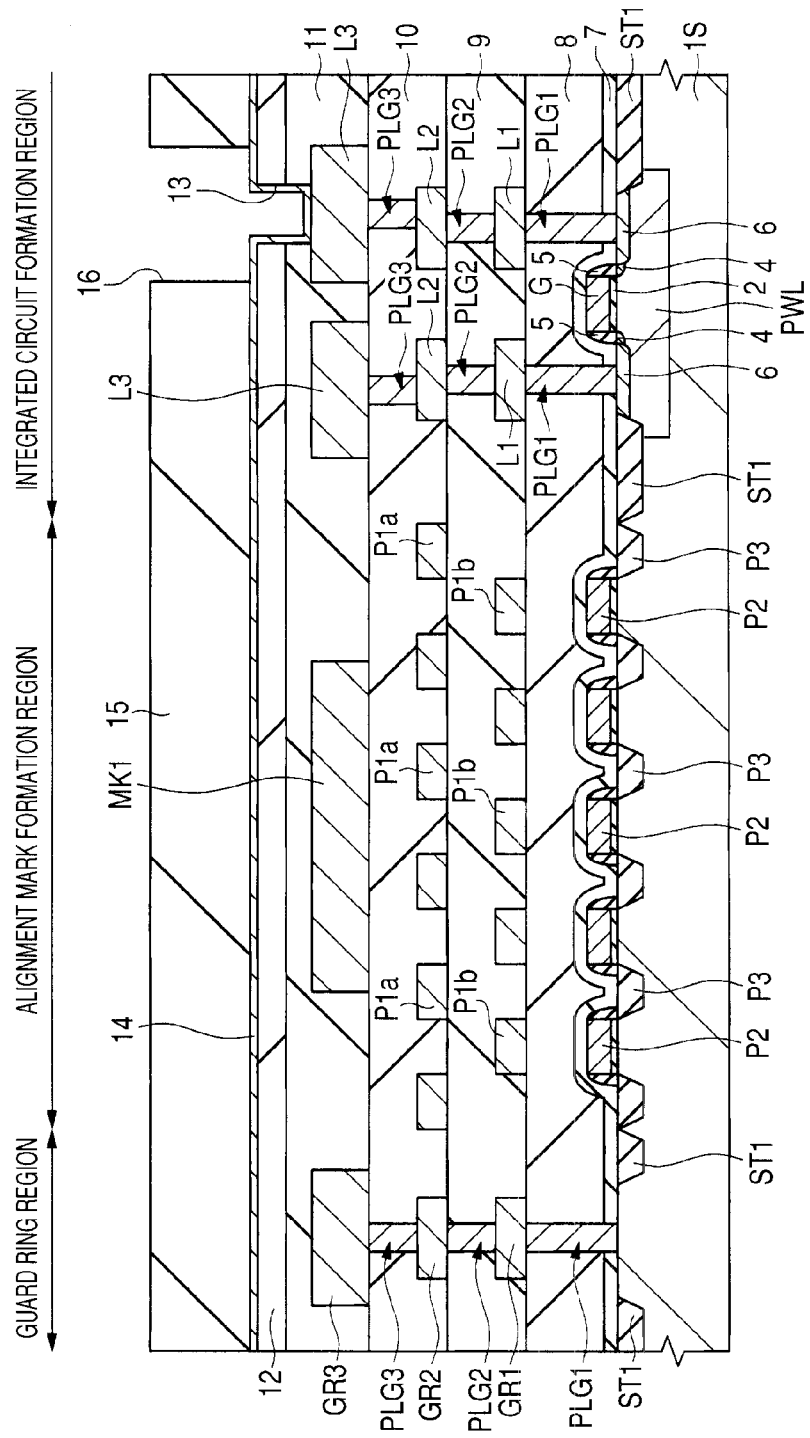
FIG. 23 is a section view showing a manufacturing process of the semiconductor device following FIG. 22.

Next, as shown in FIG. 23, the UBM (Under Bump Metal) film 14 is formed over the surface protection film including the interior of the opening 13. The UBM film 14 can be formed by using, for example, the sputtering method and is formed by a single layer film or laminated film of such as titanium film, nickel film, palladium film, titanium/tungsten alloy film, titanium nitride film, and gold film. The UBM film 14 is a film having the barrier function to move metal elements of a gold film to be formed in the later process, to the third layer wiring L3 etc. and to suppress or prevent, on the contrary, the metal elements of the third layer wiring 3 etc. from moving toward the side of the gold film, besides the function to improve adhesion between the bump electrode and the pad or the surface protection film.

Figure 24:
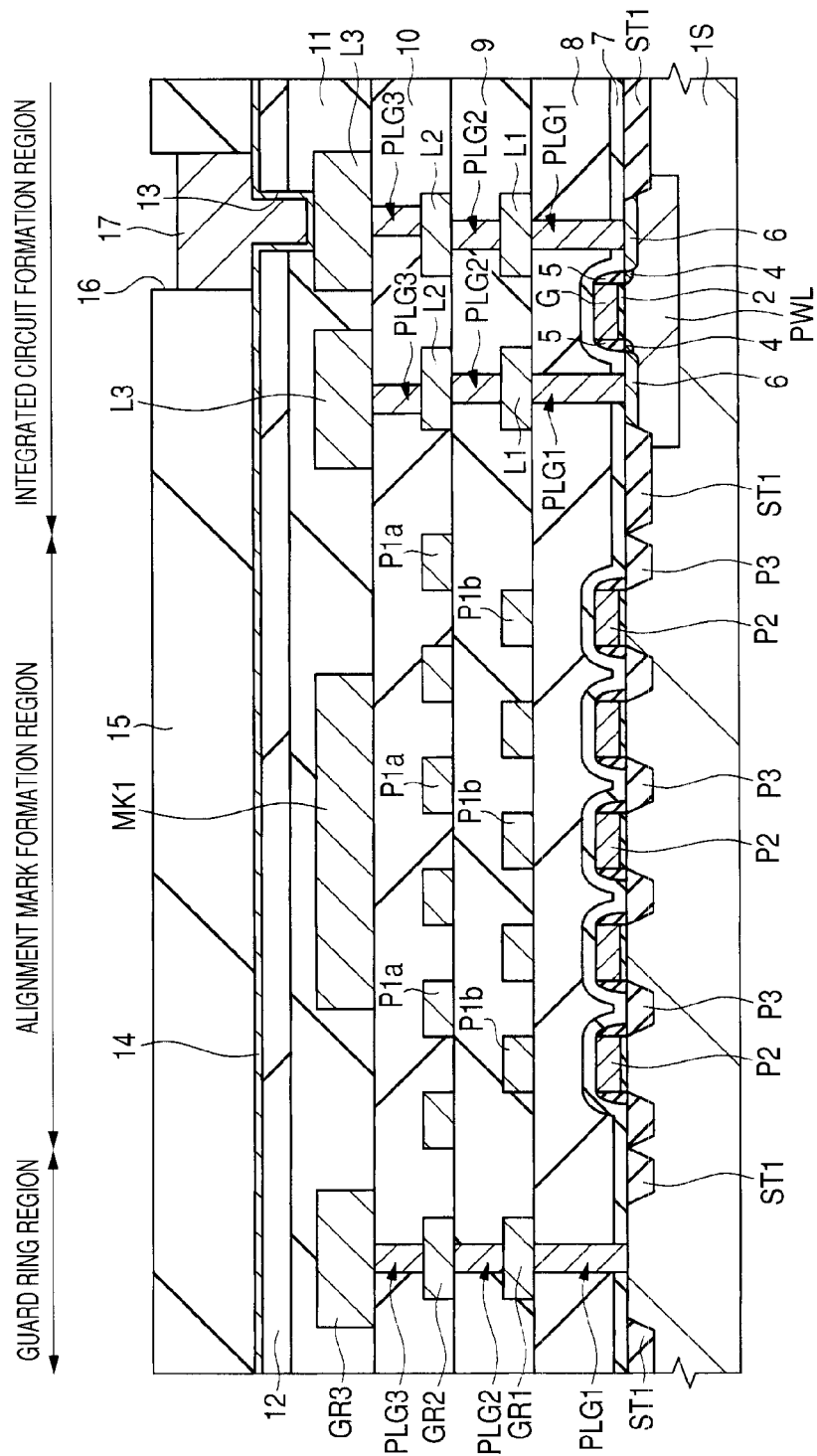
FIG. 24 is a section view showing a manufacturing process of the semiconductor device following FIG. 23.

Subsequently, after applying a resist film 15 over the UBM film 14, the resist film 15 is subjected to the exposure/development process and thus patterned. The patterning is carried out so that an opening 16 is formed without the resist film 15 being left in the bump electrode formation region. Then, as shown in FIG. 24, the gold film 17 is formed within the opening 16 using the plating method. At this time, the gold film 17 is formed over the surface protection film (silicon nitride film 12) and is also embedded in the opening 13. By embedding the gold film 17 in the opening 13, the plug is formed.

After that, by removing the patterned resist film 15 and the UBM film 14 covered with the resist film 15, the bump electrode BP1 made up of the gold film 17 and the UBM film as shown in FIG. 9 is formed. Then, by dicing the semiconductor substrate 1S, the semiconductor chip CHP into which the semiconductor substrate 1S is divided can be obtained.

Figure 25:
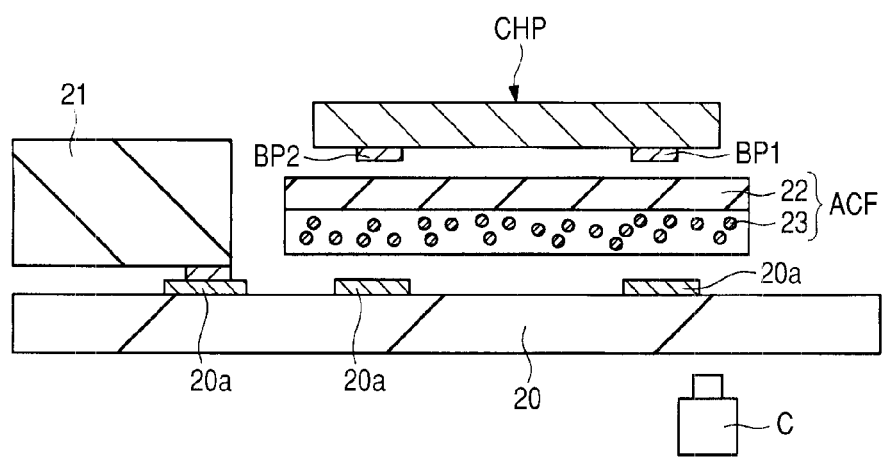
FIG. 25 is a section view showing a manufacturing process of the semiconductor device in the first embodiment.

Next, the process for adhering and mounting the semiconductor chip CHP formed as above in a mounting substrate will be described. FIG. 25 shows the case where the semiconductor chip CHP is mounted over a glass substrate 20 (COG: Chip On Glass). As shown in FIG. 25, over the glass substrate 20, a glass substrate 21 is mounted and thus the display part of the LCD is formed. Then, over the glass substrate 20 in the vicinity of the display part of the LCD, there is a region in which the semiconductor chip CHP, which is the LCD driver, is to be mounted. In the semiconductor chip CHP the bump electrodes BP1, BP2 are formed and the bump electrodes BP1, BP2 and an electrode 20a (ITO electrode) formed over the glass substrate 20 are coupled via an anisotropic conductive film ACF. The anisotropic conductive film ACF is configured so as to have an insulating layer 22 and metal particles 23.

In this process, the positioning of the semiconductor chip CHP and the electrode 20a formed over the glass substrate 20 is carried out using a camera C. In this positioning, by recognizing the alignment mark formed in the semiconductor chip CHP with the camera C, the accurate position of the semiconductor chip CHP is grasped. In the first embodiment, it is possible to make large enough the difference in contrast between the mark of the alignment mark and the background region surrounding the mark, and therefore, the visibility of the alignment mark with the camera C can be improved. Consequently, it is possible to carry out accurate positioning between the bump electrodes BP1, BP2 formed in the semiconductor chip CHP and the electrodes 20a formed over the glass substrate 20.

Figure 26:
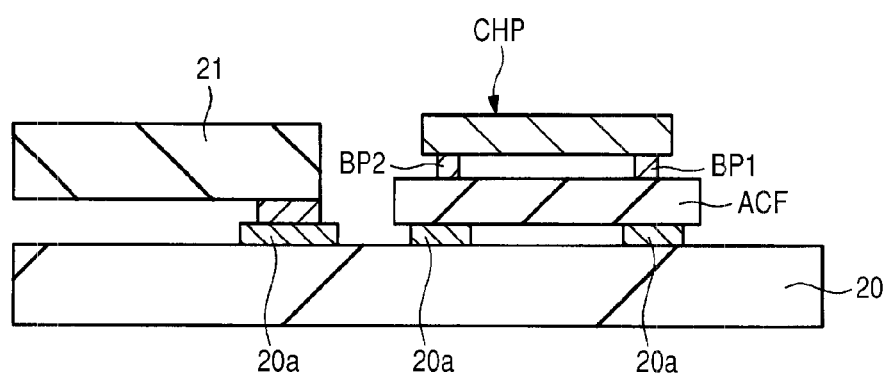
FIG. 26 is a section view showing a manufacturing process of the semiconductor device following FIG. 25.

FIG. 26 is a section view showing how the semiconductor chip CHP is mounted over the anisotropic conductive film ACF after the positioning with the camera C. In this case, because of the accurate positioning between the semiconductor chip CHP and the glass substrate 20, the bump electrodes BP1, BP2 are positioned over the electrodes 20a.

Figure 27:
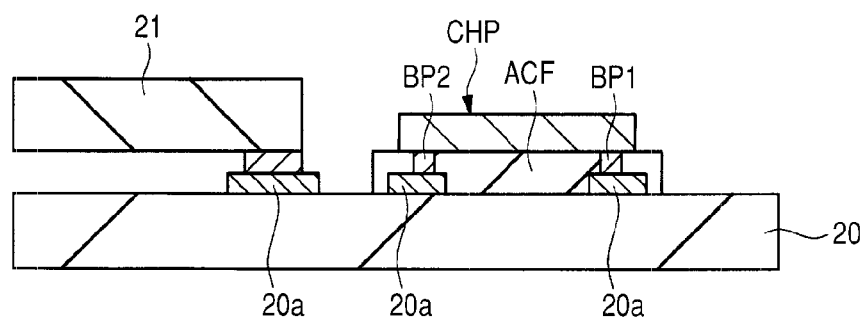
FIG. 27 is a section view showing a manufacturing process of the semiconductor device following FIG. 26.

Subsequently, as shown in FIG. 27, the bump electrodes BP1, BP2 and the terminals 20a are coupled through the anisotropic conductive film ACF. The anisotropic conductive film ACF is a film formed into a film shape by mixing conductive fine metal particles with a thermosetting resin. The metal particle is mainly made up of a ball having a diameter of 3 to 5 μm, inside of which a nickel layer and a gold plating layer are formed and the outermost of which is overlapped with an insulating layer. In this state, the anisotropic conductive film ACF is sandwiched between the terminals 20a of the glass substrate 20 and the bump electrodes BP1, BP2 of the semiconductor chip CHP when the semiconductor chip CHP is mounted in the glass substrate 20. Then, when a pressure is applied to the semiconductor chip CHP while being heated using a heater etc., the pressure is applied to only the regions corresponding to the bump electrodes BP1, BP2. Then, the metal particles dispersed in the anisotropic conductive film ACF touch and overlap each other, and then are pressed against each other. As a result, a conductive path is formed in the anisotropic conductive film ACF via the metal particles.

The metal particles in the region of the anisotropic conductive film ACF to which the pressure is not applied still have the insulating layer formed in the surface of the metal particle, and therefore, the insulation between the bump electrodes BP1 positioned side by side in the lateral direction and between the bump electrodes BP2 positioned side by side in the lateral direction can be maintained. Consequently, there is an advantage that the semiconductor chip CHP can be mounted over the glass substrate 20 without causing short circuit even if the distances between the bump electrodes BP1 and between the electrodes BP2 are small.

Figure 28:
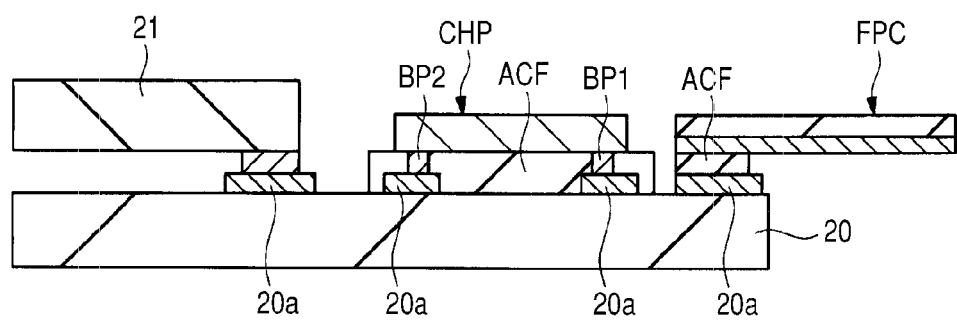
FIG. 28 is a section view showing a manufacturing process of the semiconductor device following FIG. 27.

Subsequently, as shown in FIG. 28, the glass substrate 20 and a flexible printed circuit FPC are also coupled via the anisotropic conductive film ACF. In the semiconductor chip CHP mounted over the glass substrate 20 in this manner, the bump electrode BP2 for output is electrically coupled with the display part of the LCD and the bump electrode BP1 for input is coupled with the flexible printed circuit FPC.

Figure 29:
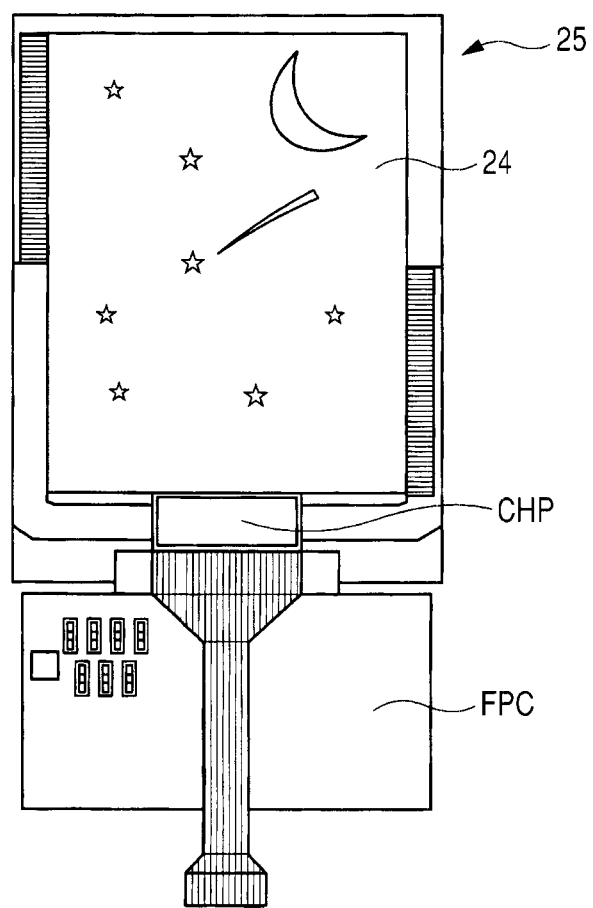
FIG. 29 is a diagram showing the entire configuration of an LCD (Liquid Crystal Display).

FIG. 29 is a diagram showing the entire configuration of an LCD (liquid crystal display unit 25). As shown in FIG. 29, on the glass substrate, a display part 24 of the LCD is formed and on the display part 24, an image is displayed. On the glass substrate in the vicinity of the display part 24, the semiconductor chip CHP, which is the LCD driver, is mounted. In the vicinity of the semiconductor chip CHP, the flexible printed circuit FPC is mounted and the semiconductor chip CHP, which is a driver, is mounted between the flexible printed circuit FPC and the display part 24 of the LCD. In this manner, the semiconductor chip CHP can be mounted on the glass substrate. As described above, it is possible to mount the semiconductor chip CHP, which is an LCD driver, on the liquid crystal display unit 25.

Second Embodiment

In the first embodiment described above, as shown in FIG. 7 and FIG. 8, the pattern P1a and the pattern P3 formed in the different layers are arranged so that they overlap in a planar manner (refer to FIG. 7) and the pattern P1b and the pattern P2 formed in the different layers are arranged so that they overlap in a planar manner (refer to FIG. 8). In contrast to this, in a second embodiment, an example will be described, in which the patterns P1a, P1b and P2 formed in the different layers are arranged so that they overlap in a planar manner but not overlap the pattern P3 in a planar manner.

Figure 30:
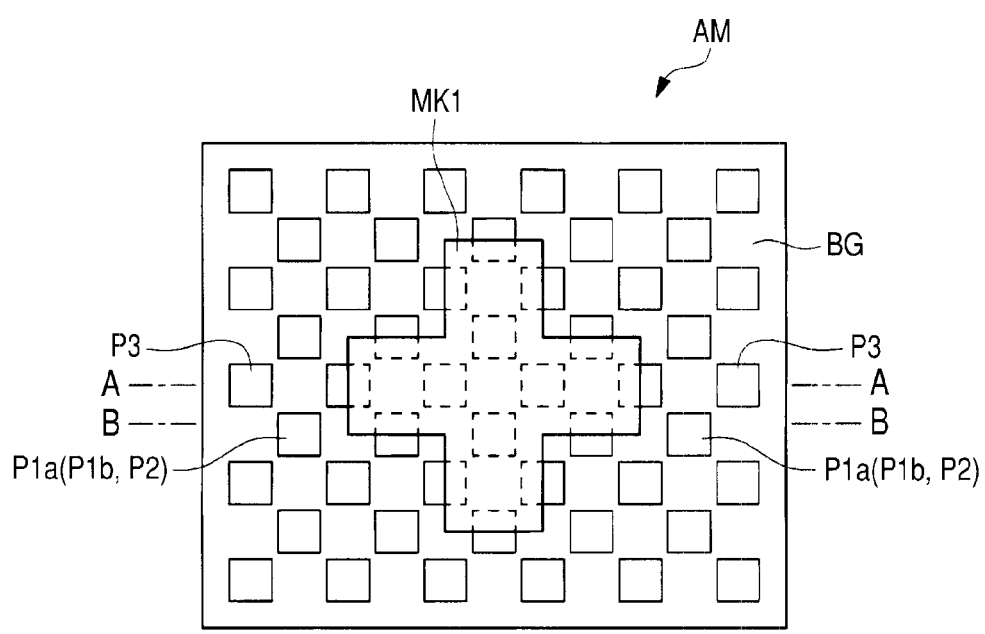
FIG. 30 is a diagram showing a configuration of the alignment mark.

FIG. 30 is a plan view showing a configuration of the alignment mark AM in the second embodiment. In the alignment mark AM in the second embodiment, the cross-shaped mark MK1 is formed in the center of the rectangular background region BG. Then, in the lower layer of the background region BG including the lower layer of the mark MK1, the dot pattern is formed. The dot pattern shown in FIG. 30 is formed across the lower layer of the mark MK1 and the lower layer of the background region BG not in the same layer as that of the mark MK1. The dot pattern in FIG. 30 shows a pattern in which patterns formed across a plurality of layers are overlapped in a planar manner not a pattern formed in the same layer. For example, the dot pattern crossed by the A-A line in FIG. 30 shows the pattern P3. That is, the A-A line in FIG. 30 is a line that cuts the arrangement region of the pattern P3 constituting the dot pattern. On the other hand, the dot pattern crossed by the B-B line in FIG. 30 shows the pattern P1a. Further, the dot pattern also shows the pattern P1b, which is a planar pattern similar to the pattern P1a, although formed in the different layer from that of the pattern P1a. Furthermore, the dot pattern also shows the pattern P2, which is a planar pattern similar to the pattern P1b, although formed in the different layer from that of the pattern P1b. That is, the B-B line in FIG. 30 is a line that cuts the arrangement region of the patterns P1a, P1b, and the pattern P2 constituting the dot pattern. As described above, the dot pattern formed in the alignment mark AM in FIG. 30 is configured by alternately arranging the patterns (P3) on the A-A line and the patterns (P1a, P1b, and P2) on the B-B line.

Figure 31:
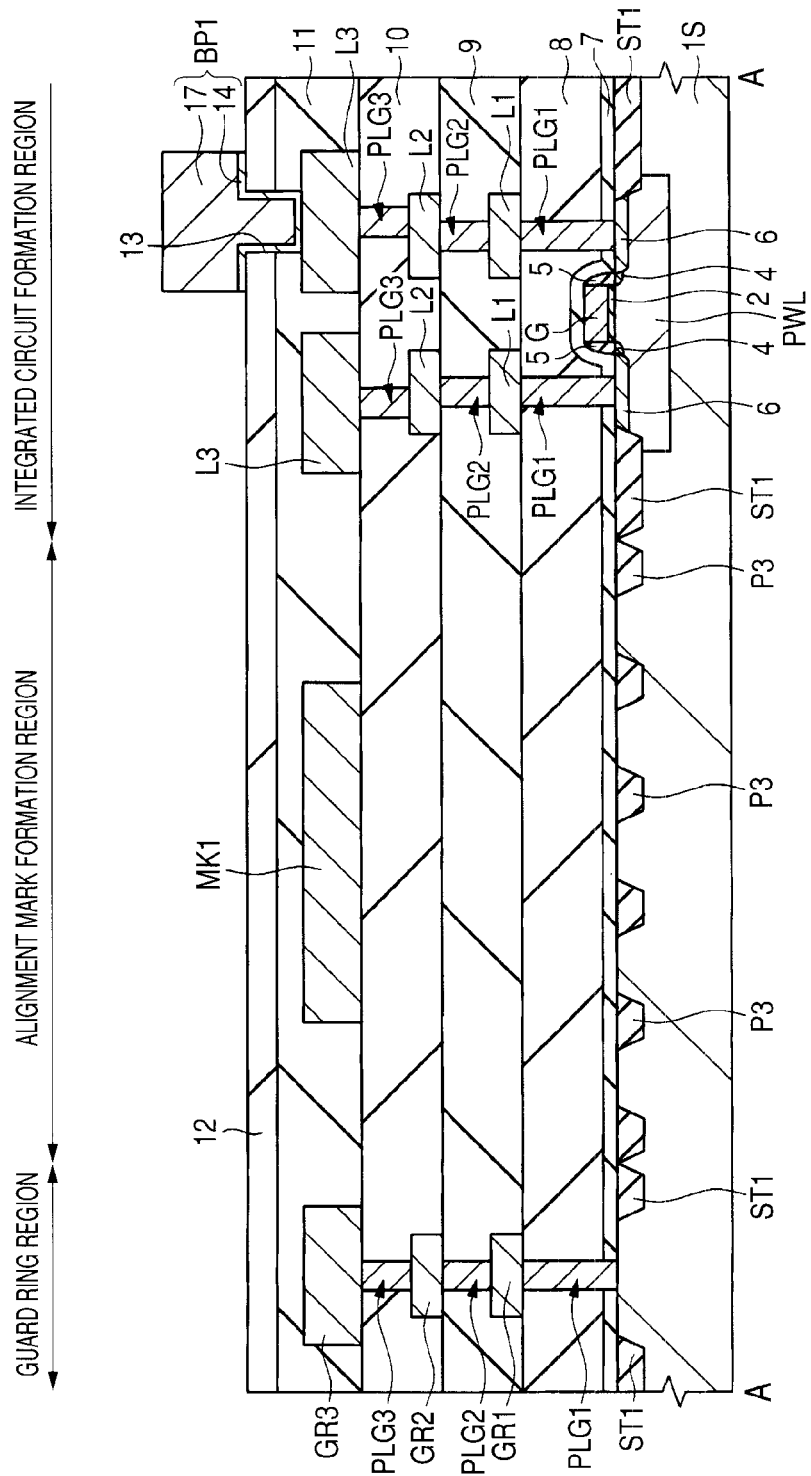
FIG. 31 is a section view cut along an A-A line in FIG. 30.

FIG. 31 is a section view cut by the A-A line in FIG. 30. It can be seen that the pattern P3 is formed over the semiconductor substrate 1S in the alignment mark formation region, as shown in FIG. 31. The pattern P3 is formed in the same layer and the same structure as those of the element isolation region STI formed in the integrated circuit formation region, as in the first embodiment.

Figure 32:
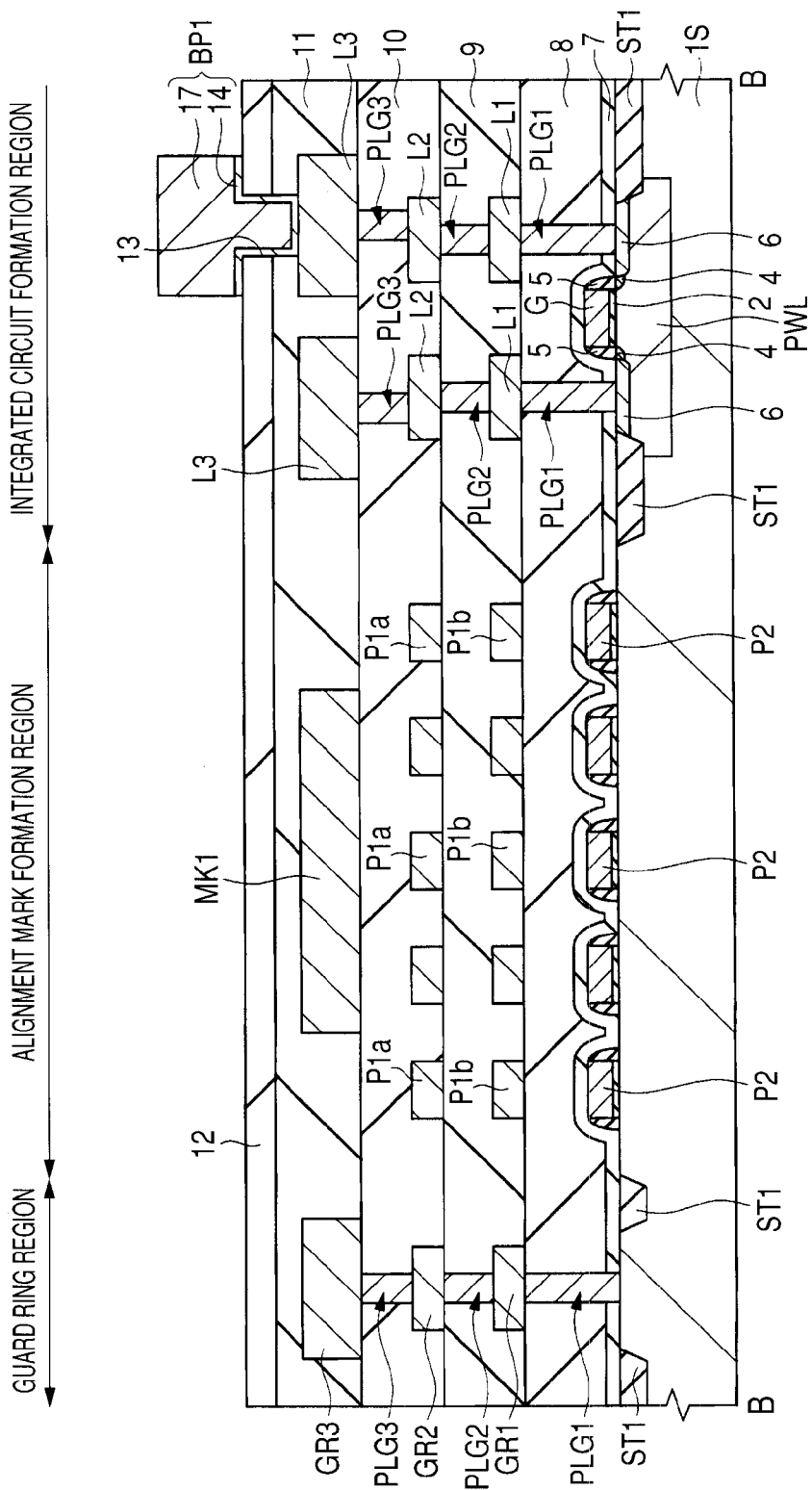
FIG. 32 is a section view cut along a B-B line in FIG. 30.

FIG. 32 is a section view cut by the B-B line in FIG. 30. It can be seen that the patterns P2, P1b and P1a are formed in the alignment mark formation region, as shown in FIG. 32. Then it can also be seen that the patterns P1a, P1b and P2 are formed in the different layers but formed so as to have the same pattern in a planar perspective.

Figure 33:
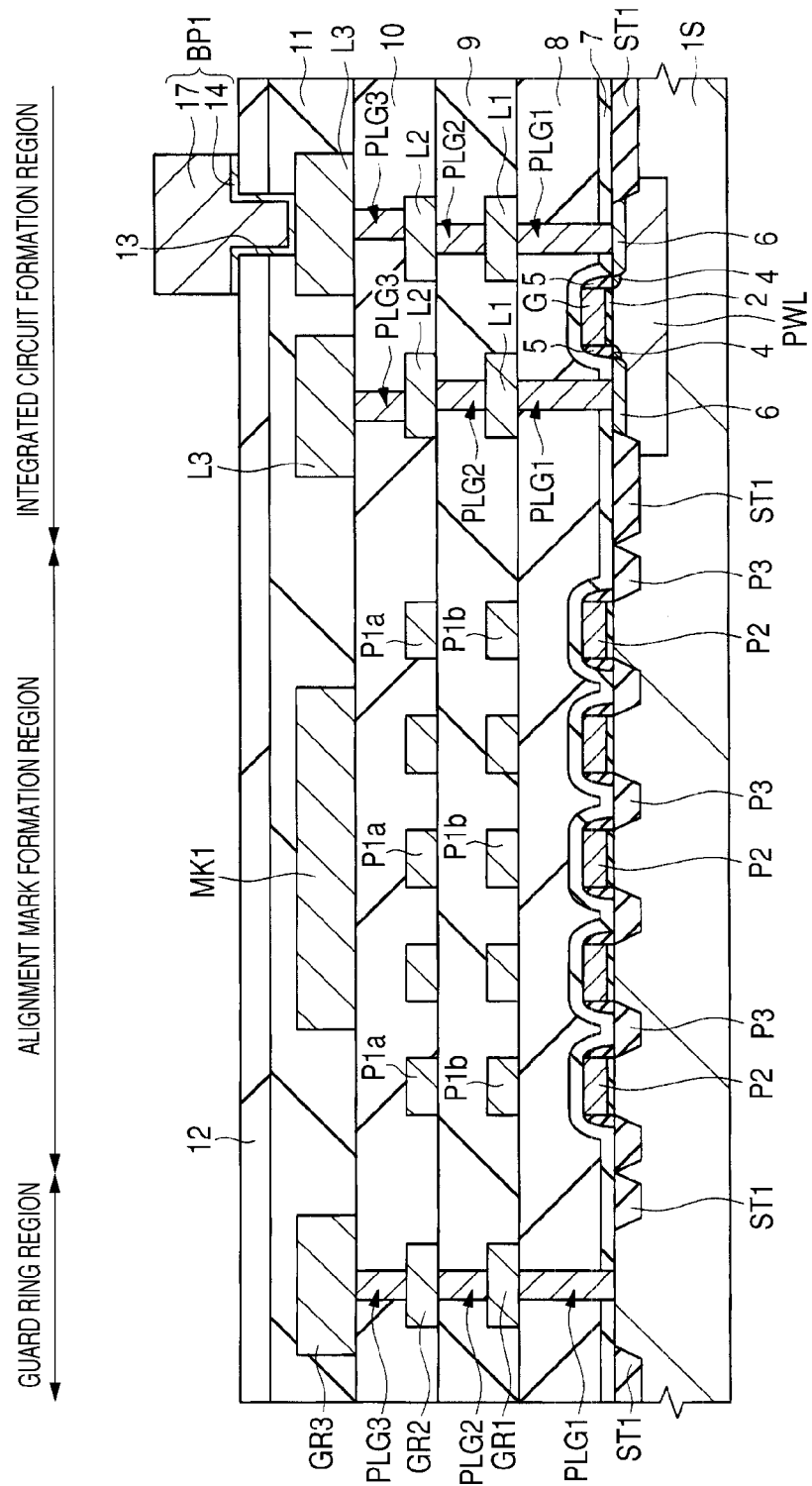

FIG. 33 is a diagram in which FIG. 31 and FIG. 32 are overlapped. With the arrangement, the positional relationship between the patterns P1a, P1b, P2 and P3 is made easier-to-see. As shown in FIG. 33, the patterns P1a, P1b, P2 and P3 are formed in the lower layer of the mark MK1 and the background region surrounding the mark MK1 and have the same pattern in a planar perspective. On the other hand, the pattern P3 is arranged so as to be shifted from the patterns P1a, P1b and P2, and the pattern P3 is arranged so as not to overlap the patterns P1a, P1b and P2 in a planar manner. As described above, in the second embodiment, the patterns P1b, P1a, P2 and P3 are formed across the four layers as in the first embodiment described above, however, the relationship of planar arrangement of the respective patters is different. Even in such a case, the same effect as that in the first embodiment can be obtained.

That is, in the second embodiment also, it is possible to make large the difference in contrast of the alignment mark by means of the first mechanism that makes use of the diffraction and interference of light, the second mechanism that makes use of the scattering and cut off of light, and the third mechanism that makes use of the evenness of the foundation pattern. As a result, the visibility of the alignment mark is improved and the positioning precision of a semiconductor chip can be improved. That is, also in the second embodiment, even if the difference in contrast of the alignment varies for each semiconductor chip, it is possible to obtain a difference in contrast that overcomes the variations. From this, it is possible to improve the visibility of the alignment mark and improve the positioning precision of any semiconductor chip even if the semiconductor chip is obtained from a different semiconductor wafer or the semiconductor chip is obtained from a different chip region of the same semiconductor chip.

As above, the invention made by the present inventors is described specifically based on the embodiments, however, it is obvious that the present invention is not limited to the above embodiments but various modifications can be made within the scope not departing from its concept.

The present invention can be used widely in the manufacturing industry that manufactures semiconductor devices.

What is claimed is:

1. A semiconductor device comprising:
  a semiconductor substrate including an alignment mark formation region and an integrated circuit formation region;
  a plurality of element isolations formed in the semiconductor substrate;

a MISFET formed in the integrated circuit formation region and having a gate electrode;
a plurality of second patterns formed in the alignment mark formation region;
a first interlayer insulating film formed over the semiconductor substrate so as to cover the MISFET and the second patterns;
a first wiring formed over the first insulating film of the integrated circuit formation region and electrically connected to the MISFET;
a plurality of first patterns formed over the first insulating film of the alignment mark formation region;
a second interlayer insulating film formed over the first interlayer insulating film so as to cover the first wiring and the first patterns;
an uppermost wiring formed over the second insulating film of the integrated circuit formation region and electrically connected to the first wiring; and
an alignment mark formed over the second insulating film of the alignment mark formation region,
wherein the alignment mark is formed at the same layer as the uppermost wiring,
wherein the second patterns are formed at the same layer as the gate electrode,
wherein the first patterns are formed at the same layer as the first wiring,
wherein the alignment mark formation is a region on which the MISFET is not formed, and
wherein the first and second patterns are not electrically connected to the MISFET.

2. A semiconductor device according to claim 1, wherein the first and second patterns are dot-shaped, respectively.

3. A semiconductor device according to claim 1, wherein the first and second patterns are arranged directly under the alignment mark.

4. A semiconductor device according to claim 1, wherein the semiconductor device is an LCD driver for a liquid crystal display device.

5. A semiconductor device according to claim 1,
wherein a guard ring, which includes wirings the same as the first wiring, the second wiring, and the uppermost wiring, is formed so as to surround the alignment mark formation region and the integrated circuit formation region,
wherein the alignment mark formation region is arranged between the guard ring and the integrated circuit formation region, and
wherein the integrated circuit formation region is not arranged between the alignment mark formation region and the guard ring.

6. A semiconductor device comprising:
a semiconductor substrate including an alignment mark formation region and an integrated circuit formation region;
a plurality of element isolations formed in the semiconductor substrate;
a MISFET formed in the integrated circuit formation region and having a gate electrode;
a plurality of third patterns formed in the alignment mark formation region;
a first interlayer insulating film formed over the semiconductor substrate so as to cover the MISFET and the third patterns;
a first wiring formed over the first insulating film of the integrated circuit formation region and electrically connected to the MISFET;
a plurality of first patterns formed over the first insulating film of the alignment mark formation region;
a second interlayer insulating film formed over the first interlayer insulating film so as to cover the first wiring and the first patterns;
an uppermost wiring formed over the second insulating film of the integrated circuit formation region and electrically connected to the first wiring; and
an alignment mark formed over the second insulating film of the alignment mark formation region,
wherein the alignment mark is formed at the same layer as the uppermost wiring,
wherein the third patterns are formed at the same layer as the element isolations,
wherein the first patterns are formed at the same layer as the first wiring,
wherein the alignment mark formation is a region on which the MISFET is not formed, and
wherein the first and third patterns are not electrically connected to the MISFET.

7. A semiconductor device according to claim 6, wherein the first and third patterns are dot-shaped, respectively.

8. A semiconductor device according to claim 6, wherein the first and third patterns are arranged directly under the alignment mark.

9. A semiconductor device according to claim 6, wherein the semiconductor device is an LCD driver for a liquid crystal display device.

10. A semiconductor device according to claim 6,
wherein a guard ring, which includes wirings the same as the first wiring, the second wiring, and the uppermost wiring, is formed so as to surround the alignment mark formation region and the integrated circuit formation region,
wherein the alignment mark formation region is arranged between the guard ring and the integrated circuit formation region, and
wherein the integrated circuit formation region is not arranged between the alignment mark formation region and the guard ring.

11. A semiconductor device comprising:
a semiconductor substrate including an alignment mark formation region and an integrated circuit formation region;
a plurality of element isolations formed in the semiconductor substrate;
a MISFET formed in the integrated circuit formation region and having a gate electrode;
a plurality of second patterns formed in the alignment mark formation region;
a plurality of third patterns formed in the alignment mark formation region;
a first interlayer insulating film formed over the semiconductor substrate so as to cover the MISFET, the second patterns and the third patterns;
a first wiring formed over the first insulating film of the integrated circuit formation region and electrically connected to the MISFET;
a plurality of first patterns formed over the first insulating film of the alignment mark formation region;
a second interlayer insulating film formed over the first interlayer insulating film so as to cover the first wiring and the first patterns;
an uppermost wiring formed over the second insulating film of the integrated circuit formation region and electrically connected to the first wiring; and an alignment mark formed over the second insulating film of the alignment mark formation region, wherein the alignment mark is formed at the same layer as the uppermost wiring, wherein the third patterns are formed at the same layer as the element isolations, wherein the second patterns are formed at the same layer as the gate electrode, wherein the first patterns are formed at the same layer as the first wiring, wherein the alignment mark formation is a region on which the MISFET is not formed, and wherein the first, second and third patterns are not electrically connected to the MISFET.

12. A semiconductor device according to claim 11, wherein the first, second and third patterns are dot-shaped, respectively.

13. A semiconductor device according to claim 11, wherein the first, second and third patterns are arranged directly under the alignment mark.

14. A semiconductor device according to claim 11, wherein the semiconductor device is an LCD driver for a liquid crystal display device.

15. A semiconductor device according to claim 11, wherein a guard ring, which includes wirings the same as the first wiring, the second wiring, and the uppermost wiring, is formed so as to surround the alignment mark formation region and the integrated circuit formation region, wherein the alignment mark formation region is arranged between the guard ring and the integrated circuit formation region, and wherein the integrated circuit formation region is not arranged between the alignment mark formation region and the guard ring.

* * * * *